United States Patent
Floyd et al.

(10) Patent No.: US 7,486,145 B2
(45) Date of Patent: Feb. 3, 2009

(54) CIRCUITS AND METHODS FOR IMPLEMENTING SUB-INTEGER-N FREQUENCY DIVIDERS USING PHASE ROTATORS

(75) Inventors: Brian A. Floyd, Mahopac, NY (US); Sergey V. Rylov, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 11/621,879

(22) Filed: Jan. 10, 2007

(65) Prior Publication Data
US 2008/0164917 A1 Jul. 10, 2008

(51) Int. Cl.
*H03L 7/00* (2006.01)
(52) U.S. Cl. .............. 331/1 A; 331/74; 331/34; 331/16; 327/156; 327/115; 377/48
(58) Field of Classification Search ............ 331/1 A, 331/16, 74, 34; 377/48; 327/156, 115
See application file for complete search history.

(56) References Cited

U.S. PATENT DOCUMENTS

| | | | |
|---|---|---|---|
| 4,758,802 A | 7/1988 | Jackson | |
| 4,796,188 A | 1/1989 | Gale et al. | |
| 5,224,132 A | 6/1993 | Goldberg | |
| 5,304,938 A | 4/1994 | Gregory et al. | |
| 5,307,071 A | 4/1994 | Arnold et al. | |
| 5,656,958 A | 8/1997 | Albert et al. | |
| 5,970,110 A | 10/1999 | Li | |
| 5,982,840 A | 11/1999 | Aisaka | |
| 6,067,339 A | 5/2000 | Knapp et al. | |
| 6,400,233 B1 | 6/2002 | Thomas | |
| 6,671,341 B1 | 12/2003 | Kinget et al. | |
| 6,931,089 B2 | 8/2005 | Wu et al. | |
| 7,003,049 B2 | 2/2006 | Hietala | |
| 7,181,180 B1 * | 2/2007 | Teo et al. | 455/260 |
| 7,417,510 B2 * | 8/2008 | Huang | 331/74 |
| 2006/0290433 A1 | 12/2006 | Leenaerts et al. | |

FOREIGN PATENT DOCUMENTS

EP 1341309 9/2003

OTHER PUBLICATIONS

Masoud Zargari et al., "Single-Chip Dual-Band Tri-Mode CMOS Tranceiver for IEEE 802.11 a/b/g Wireless LAN", IEEE Journal of Solid-State Circuits, vol. 39, No. 12, Dec. 2004, pp. 2239-2249.

(Continued)

*Primary Examiner*—Arnold Kinkead
(74) *Attorney, Agent, or Firm*—F. Chau & Associates, LLC

(57) ABSTRACT

Circuits and methods are provided for implementing programmable sub-integer N frequency dividers for use in, e.g., frequency synthesizer applications, providing glitch free outputs signals with minimal fractional spurs. Phase-rotating sub-integer N frequency dividers are programmable to provide multi-modulus division with a wide range of arbitrary sub-integer division ratios.

33 Claims, 15 Drawing Sheets

OTHER PUBLICATIONS

Keliu Shu, et al., "A 2.4-GHz Monolithic Fractional-N Frequency Synthesizer with Robust Phase-Switching Prescaler and Loop Capacitance Muliplier", IEEE Journal of Solid-State Circuits, vol. 38, No. 6, Jun. 2003, pp. 866-874.

Michel S.J. Steyaert, et al., "A 2-V CMOS Cellular Transceiver Front-End", IEEE Journal of Solid-State Circuits, vol. 35, No. 12, Dec. 2000, pp. 1895-1907.

Jan Craninckx, et al., "A 1.75-GHz/3-V Dual Modulus Divide-by-128/129 Prescaler in 0.7-um CMOS", IEEE Journal of Solid-State Circuits, vol. 31, No. 7, Jul. 1996, pp. 890-897.

Gerry C.T. Leung et al. "A 1-V 5.2-GHz CMOS Synthesizer for WLAN Applications", IEEE Journal of Solid-State Circuits, vol. 39, No. 11, Nov. 2004, pp. 1873-1882.

* cited by examiner

Table 1: Multi-modulus divider values for M=2, A=2, B=4, P=7 or 8
$N_{TOT} = ABP + A/2^M(Pk_2+S) = 8P + 0.5(Pk_2+S)$

| P | S | $k_2$ | $k_1$ | N=8P +0.5($Pk_2$+S) |
|---|---|---|---|---|
| 7 | 0 | -1 | 0 | 52.5 |
| 7 | 1 | -1 | 0 | 53.0 |
| 7 | 2 | -1 | 0 | 53.5 |
| 7 | 3 | -1 | 0 | 54.0 |
| 7 | 4 | -1 | 0 | 54.5 |
| 7 | 5 | -1 | 0 | 55.0 |
| 7 | 6 | -1 | 0 | 55.5 |
| 7 | 7 | -1 | 0 | 56.0 |
| 7 | 0 | 0 | +1 | 56.5 |
| 7 | 1 | 0 | +1 | 57.0 |
| 7 | 2 | 0 | +1 | 57.5 |
| 7 | 3 | 0 | +1 | 58.0 |
| 7 | 4 | 0 | +1 | 58.5 |
| 7 | 5 | 0 | +1 | 59.0 |
| 7 | 6 | 0 | +1 | 59.5 |
| 7 | 7 | 0 | +1 | |
| 8 | 0 | -1 | 0 | 60.0 |
| 8 | 1 | -1 | 0 | 60.5 |
| 8 | 2 | -1 | 0 | 61.0 |
| 8 | 3 | -1 | 0 | 61.5 |
| 8 | 4 | -1 | 0 | 62.0 |
| 8 | 5 | -1 | 0 | 62.5 |
| 8 | 6 | -1 | 0 | 63.0 |
| 8 | 7 | -1 | 0 | 63.5 |
| 8 | 8 | -1 | 0 | 64.0 |
| 8 | 0 | 0 | +1 | 64.5 |
| 8 | 1 | 0 | +1 | 65.0 |
| 8 | 2 | 0 | +1 | 65.5 |
| 8 | 3 | 0 | +1 | 66.0 |
| 8 | 4 | 0 | +1 | 66.5 |
| 8 | 5 | 0 | +1 | 67.0 |
| 8 | 6 | 0 | +1 | 67.5 |
| 8 | 7 | 0 | +1 | 68.0 |
| 8 | 8 | 0 | +1 | |

FIG. 12

Table 2: Multi-modulus divider values for M=4, A=2, B=4, P=7 or 8
$N_{TOT} = ABP + A/2^M(Pk_2+S) = 64 + k_2 + 0.125*S$

| S | $k_3,k_1$ -4,-3 | $k_3,k_1$ -3,-2 | $k_3,k_1$ -2,-1 | $k_3,k_1$ -1,0 | $k_3,k_1$ 0,+1 | $k_3,k_1$ +1,+2 | $k_3,k_1$ +2,+3 | $k_3,k_1$ +3,+4 |
|---|---|---|---|---|---|---|---|---|
| 0 | 60.000 | 61.000 | 62.000 | 63.000 | 64.000 | 65.000 | 66.000 | 67.000 |
| 1 | 60.125 | 61.125 | 62.125 | 63.125 | 64.125 | 65.125 | 66.125 | 67.125 |
| 2 | 60.250 | 61.250 | 62.250 | 63.250 | 64.250 | 65.250 | 66.250 | 67.250 |
| 3 | 60.375 | 61.375 | 62.375 | 63.375 | 64.375 | 65.375 | 66.375 | 67.375 |
| 4 | 60.500 | 61.500 | 62.500 | 63.500 | 64.500 | 65.500 | 66.500 | 67.500 |
| 5 | 60.625 | 61.625 | 62.625 | 63.625 | 64.625 | 65.625 | 66.625 | 67.625 |
| 6 | 60.750 | 61.750 | 62.750 | 63.750 | 64.750 | 65.750 | 66.750 | 67.750 |
| 7 | 60.875 | 61.875 | 62.875 | 63.875 | 64.875 | 65.875 | 66.875 | 67.875 |
| 8 | 61.000 | 62.000 | 63.000 | 64.000 | 65.000 | 66.000 | 67.000 | 68.000 |

FIG. 14

CIRCUITS AND METHODS FOR IMPLEMENTING SUB-INTEGER-N FREQUENCY DIVIDERS USING PHASE ROTATORS

GOVERNMENT LICENSE RIGHTS

This invention was made with Government support under Contract No. N66001-02-C-8014 awarded by the Defense Advanced Research Projects Agency (DARPA). The Government has certain rights in this invention.

TECHNICAL FIELD OF THE INVENTION

The present invention relates generally to circuits and methods for implementing programmable sub-integer N frequency dividers for use in, e.g., frequency synthesizer applications, and more specifically, phase-switched sub-integer N frequency dividers that are programmable to provide multi-modulus division with a wide range of arbitrary sub-integer division ratios.

BACKGROUND

Phase-locked loop (PLL) circuits are critical components commonly implemented in various communications systems to provide, e.g., LO (local oscillator) signals for transceiver circuits, clock signals for data-recovery circuits, etc. In general, a PLL circuit uses feedback to maintain an output signal of the PLL in a specific phase relationship with a reference input signal of the PLL, as is well known in the art. When the output frequency of the PLL is equal to the frequency of the reference input signal, the PLL is in a "locked" condition.

PLL circuits are commonly implemented to construct frequency synthesizer circuits for use in various applications which it is desirable to generate one or more of a plurality of new clock signals based on a reference clock signal. Essentially, a frequency synthesizer is a PLL that employs a programmable frequency divider in the PLL feedback loop. By way of example, FIG. 1 is a high-level schematic illustration of a conventional PLL frequency synthesizer circuit (10). The PLL frequency synthesizer (10) comprises a PFD (phase-frequency detector) circuit (11), a charge pump (12), a loop filter (13), a VCO (voltage controlled oscillator) circuit (14), and a frequency divider (15) in a PLL feedback loop.

In general, the PLL frequency synthesizer (10) generates an output signal Vout having a frequency $f_{out}$ that is some multiple N of the frequency $f_{in}$ of a reference clock signal Ref_CLK, where $f_{out}=N \times f_{Ref}$. The PFD circuit (11) receives the input reference signal Ref_CLK and a feedback signal $f_{Div}$ and compares the phases of such signals. The PFD (11) generates a slowly varying phase error output signal that is a function of the phase difference between the reference and feedback signals. The charge pump (12) operates in conjunction with the PFD (1) to generate an output current signal based on the detected phase difference. The loop filter (13) low-pass filters the phase error signal generated by the PFD (11) and CP (12) and outputs a control voltage to the VCO (14). In general, the charge pump (12) and loop filter (13) operate to amplify and filter the phase error signal output from the PFD (11) according to a filter transfer function that is selected to achieve desired loop characteristics such as gain, bandwidth, frequency response, etc., in a manner well known in the art.

The control voltage output from the loop filer (13) is a control signal that is input to a control port of the VCO (14). The VCO (14) may be a voltage controlled LC tank oscillator where frequency tuning is achieved based on the voltage level of the control signal output from the loop filter (13). The control signal voltage incrementally increases or decreases so as to drive the VCO (14) output frequency $f_{out}$ in the direction of $N \times f_{Ref}$. The output signal $V_{out}$ is feedback to the PFD (11) via the frequency divider circuit (15), which divides the VCO output frequency by the division ratio N to generate a low frequency signal $f_{Div}$, where $f_{Ref}=f_{Div}$ when the PLL frequency synthesizer achieves the desired "locked" state.

As noted above, a fundamental function of a PLL is to lock the phase of the output signal to the phase of the reference signal. In general, standard Laplace transform theory can be used to show that the PLL tracks the input phase within a certain loop bandwidth, acting as a low-pass filter with respect to the carrier frequency to phase fluctuations on the input reference signal Ref_CLK. From a phase-noise perspective, this means that the phase noise of Ref_CLK is passed within the bandwidth of the loop and actually amplified by the division factor (20*log 10(N)). Similarly, the combined phase noise from the frequency divider (15), the PFD (11), charge pump (12), and the loop filter (13) is amplified by the division factor N within the loop bandwidth.

Conversely, phase noise from the VCO (14) is rejected within the bandwidth of the loop, but is passed outside the bandwidth. In other words, the PLL essentially acts as a high-pass filter with respect to the carrier frequency to phase fluctuations on the VCO (14). In addition to setting the phase-noise profile, the loop bandwidth also determines the locking time of the PLL through a converse relationship, i.e., BW~1/τ. It is noted that the bandwidth cannot be set arbitrarily large, as loop instabilities can result. Therefore, as a rule of thumb, the loop bandwidth is limited to about an order of magnitude less than the Ref_CLK frequency.

In general, the PLL frequency synthesizer (10) may be implemented as an "integer-N" synthesizer or "fractional-N" synthesizers, depending on the frequency division ratio N of the frequency divider circuit (15). In particular, with an "integer-N" architecture, the division ratio N of the frequency divider (15) is selected such that the output frequency of the VCO is only an integer multiple of the reference frequency Consequently, the reference frequency cannot be higher in frequency than the desired step size (channel resolution). An integer-N PLL synthesizer framework is advantageous in terms of having a simple architecture/design and having fewer spurs in the output spectrum.

On the other hand, a fractional-N synthesizer allows frequencies equal to fractional multiples of the reference frequency $f_{Ref}$ to be synthesized. That is, the division ratio N of the frequency divider (15) can be a fractional number, which, for a given channel resolution, allows the reference clock to be at a higher frequency. A fractional-N type synthesizer offers several advantages over integer-N synthesizers. First, the loop bandwidth can be increased, since the bandwidth of the loop is usually confined to be about $f_{Ref}/10$ for stability purposes. The larger loop bandwidth results in suppression of the VCO phase noise over a larger range. Secondly, the higher $f_{REF}$ means that the division factor is smaller, resulting in reduced in-band phase noise.

Conventional fractional-N synthesizers can be implemented using various techniques known in the art. For instance, a fractional-N synthesizer may be built using dual-modulus frequency dividers, where the modulus of the divider is switched between two division ratios, N and N+1, whereby the average division ratio is determined based on the ratio of the time in a predetermined period at which N and N+1 divisor were applied. For example, a dual-modulus divide-by-128/129 frequency divider can be controlled such that it divides by 128 97% of the time and by 129 3% of the time. The overall division ratio is then 128.03.

With this technique, if the switching between the two division ratios is periodic then a fractional spur will result, occurring at multiple frequencies of $f_{Ref}/100$ for this example. Consequently, fractional-N synthesizers typically employ delta-sigma (Δ-Σ) modulators to vary the modulus in a random fashion and to shape to resultant quantization noise to fall outside of the passband of the PLL. For certain applications, however, the channel resolution is not significantly tight to warrant a full-blown Δ-Σ synthesizer, although it is still desirable to realize fractional division ratios.

Another technique for implementing a fractional-N synthesizer, is based on a phase-switched frequency divider architecture, where different divide factors of a multi-modulus prescaler realized using a phase rotator or phase selector to switch between different phase states of a plurality of phase shifted signals generated by the frequency divider, e.g., 4 signals having the same frequency but phases shifted by 0, 90, 180 and 270 degrees. For instance, in most implementations, switching is performed by transitioning from one phase state to a next phase state with is 90° lagging in phase (e.g., from I to Q), resulting in a scaling of the period by 1.25. Division by one value can be achieved by selecting one of four phase states while division by another value can be achieved by continuously rotating among the phase states at every cycle.

A key advantage to using phase-switched dividers is that such dividers can be realized with fewer elements operating at the full rate and, therefore, can operate at higher frequencies or lower power consumptions. A key drawback is that the switch between different phase states can result in glitches in the output signal. Also, fractional spurs may result at ¼, ½, and ¾ the reference clock frequency for 90° rotations if the phase difference between I and Q is not precisely 90°.

SUMMARY OF THE INVENTION

Exemplary embodiments of the invention generally include circuits and methods for implementing programmable sub-integer N frequency dividers for use in, e.g., frequency synthesizer applications, providing glitch free outputs signals with minimal fractional spurs. Exemplary embodiments of the invention more specifically include phase-rotating sub-integer N frequency dividers that are programmable to provide multi-modulus division with a wide range of arbitrary sub-integer division ratios.

In one exemplary embodiment of the invention, a fractional frequency divider circuit includes a prescaler circuit, a phase rotator circuit, a phase rotator controller, and a postscaler circuit. The prescaler circuit divides a frequency of an input signal by a factor of A and outputs a plurality of phase-shifted signals each having a frequency of 1/A, the phase-shifted signals comprising differential I (in-phase) and Q (quadrature-phase) phase signals. The phase rotator circuit can phase interpolate between the plurality of phase-shifted signals output from the prescaler circuit to generate a plurality of phase-shift states having a minimum phase-shift resolution of Δϕ. The phase rotator controller generates control signals to control the operation of the phase rotator circuit. The phase rotator circuit rotatably outputs one or more of the plurality of phase-shift states in accordance with an angular direction of rotation and a phase-shift output resolution, ±k Δϕ, as specified by the control signals. The postscaler circuit divides a frequency of an output signal of the phase rotator circuit by a factor of B, and which outputs a clock signal which controls the phase rotator controller and which defines a control cycle for the phase rotator circuit. The fractional frequency divider circuit generates arbitrary sub-integer-N divisor N(k)=(AB+ Ak Δϕ/2π), wherein at least k is a programmable parameter, wherein AB denotes an integer portion of the divisor, wherein where $$A \frac{\Delta\phi}{2\pi}$$

denotes a minimum fractional portion of the divisor, and wherein A and B can be integer values ≧1.

In one embodiment, the phase rotator circuit is an M-bit phase rotator circuit that can generate a plurality of phase-shift states having a minimum phase-shift resolution $$\Delta\phi = \frac{2\pi}{2^M},$$

and k is programmable to be any integer value, including 0, where $|\pm k| \leq 2^{M-2}$. For example, the values of M and k can be set such that M=2 and k is −1, 0, or +1, to thereby provide a programmable tri-modulus frequency divider circuit. In another embodiment, the values of M and k can be set such that M=4 and k is −4, −3, −2, −1, 0, +1, +2, +3 or +4, to thereby provide a programmable nine-modulus frequency divider circuit.

In another exemplary embodiment of the invention, the fractional frequency divider may include a slewing buffer operatively connected between an output of the phase rotator control circuit and control signal input ports of the phase rotator, and a limiter amplifier coupled to the output of the phase rotator. The slewing buffer delays or otherwise increases a slew rate of control signals output from the phase rotator controller to smoothly interpolate from one phase-shift state to a next-phase shift state, to thereby reduce or eliminate glitches in the output signal of the phase rotator circuit, and the limiter amplifier maintains a constant amplitude of the output signal of the phase rotator circuit by compensating for decreases in the amplitude of the output signal of the phase rotator which may occur by virtue of using slewed control signals.

In yet another exemplary embodiment of the inventions, a fractional frequency divider circuit includes a prescaler circuit, a phase rotator circuit, a modulus controller having a program-swallowed framework, and a postscaler circuit. The prescaler circuit divides a frequency of an input signal by a factor of A and outputs a plurality of phase-shifted signals each having a frequency of 1/A, the phase-shifted signals comprising differential I (in-phase) and Q (quadrature-phase) phase signals. The phase rotator circuit can phase interpolate between the plurality of phase-shifted signals output from the prescaler circuit to generate a plurality of phase-shift; states having a minimum phase-shift resolution of Δϕ. The modulus controller generates control signals to control the operation of the phase rotator circuit. The phase rotator circuit rotatably outputs one or more of the plurality of phase-shift states in accordance with an angular direction of rotation and a phase-shift output resolution as specified by the control signals. The modulus controller comprises a phase rotator control circuit and a P counter and an S counter providing the and a program-swallowed framework. The postscaler circuit that divides a frequency of an output signal of the phase rotator by a factor of B, and outputs a clock signal which controls the modulus controller and defines a control cycle for the phase rotator circuit. In this embodiment, the fractional frequency divider circuit generates an arbitrary sub-integer-N divisor, $$N_{TOT}(k_1, k_2) = ABP + A\frac{\Delta\phi}{2\pi}[Pk_2 + S(k_1 - k_2)],$$

wherein at least $k_2$ and $k_1$ and S are programmable parameters, wherein ABP denotes an integer portion of the divisor and where $$A\frac{\Delta\phi}{2\pi}$$

denotes a minimum fractional portion of the divisor, and wherein A, B and P can be integer values $\geqq 1$, and wherein S can be an integer value $\geqq 0$ and $\leqq P$.

In another embodiment, the phase rotator circuit is an M-bit phase rotator, providing a minimum phase shift resolution $$\Delta\phi = \frac{2\pi}{2^M}$$

and the values of $k_1$ and $k_2$ are programmable to be any integer value, including 0, wherein $|\pm k_1| \leqq 2^{M-2}$, $|\pm k_2| \leqq 2^{M-2}$ and $k_1 - k_2 = 1$. For example, the values of M, $k_1$ and $k_2$ can be set as M=2, $k_1$=0 or +1 and $k_2$=−1 or 0, to thereby provide a programmable tri-modulus frequency divider circuit. In another embodiment, the values of M, $k_1$ and $k_2$ can be set as M=4, $k_1$=−3, −2, −1, 0, +1, +2, +3 or +4, and $k_2$=−4, −3, −2, −1, 0, +1, +2, or +3, to provide a programmable nine-modulus frequency divider circuit.

In another embodiment, the fractional frequency divider circuit may further include a slewing buffer operatively connected between an output of the phase rotator control circuit and control signal input ports of the phase rotator and a limiter amplifier coupled to the output of the phase rotator. The slewing buffer delays or otherwise increases a slew rate of control signals output from the phase rotator controller to smoothly interpolate from one phase-shift state to a next-phase shift state, to thereby reduce or eliminate glitches in the output signal of the phase rotator circuit, and the limiter amplifier maintains a constant amplitude of the output signal of the phase rotator circuit by compensating for decreases in the amplitude of the output signal of the phase rotator which may occur by virtue of using slewed control signals.

In other exemplary embodiment of the invention, the fractional frequency divider circuits may be used to construct PLL (phase-locked loop) frequency synthesizer circuits, which include a phase detector, a low pass filter coupled to the output of the phase detector, and a VCO (voltage controlled oscillator) coupled to the output of the low pass filter, wherein the fractional frequency divider circuit is connected in a feedback loop between an output of the VCO and an input to the phase detector.

These and other exemplary embodiments, features and advantages of the present invention will be described or become apparent from the following detailed description of exemplary embodiments, which is to be read in connection with the accompanying drawings.

BRIEF DESCRIPTION OF THE DRAWINGS

FIG. 12 is an exemplary table diagram which illustrates a range of arbitrary division ratio values that may be obtained for the exemplary frequency divider embodiment of FIG. 11.

FIG. 14 is an exemplary table diagram which illustrates a range of arbitrary division ratio values that may be obtained for the exemplary frequency divider embodiment of FIG. 13.

DETAILED DESCRIPTION OF EXEMPLARY EMBODIMENTS

Figure 2:
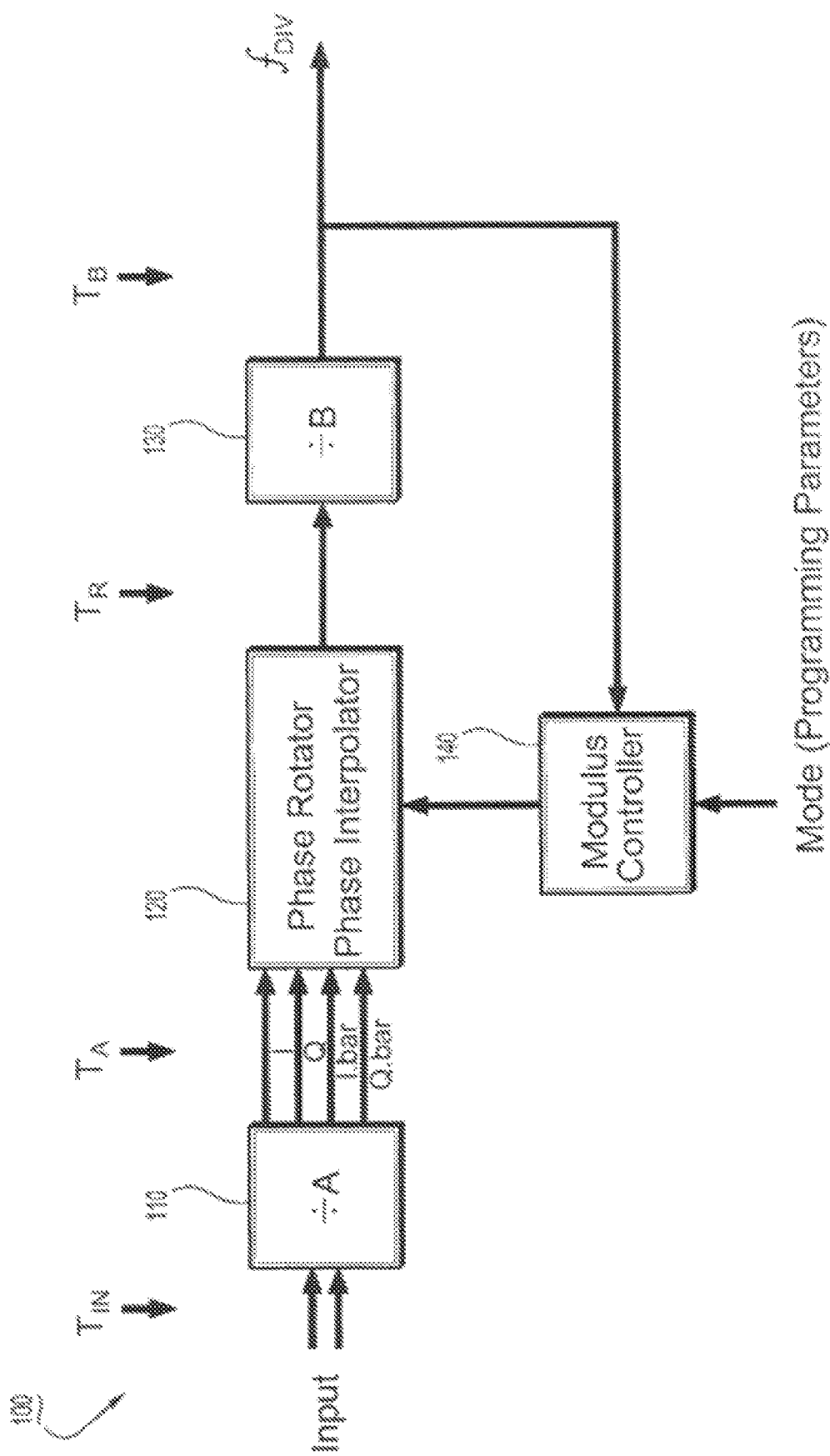
FIG. 2 is a schematic circuit diagram of a programmable sub-integer N frequency divider circuit according to an exemplary embodiment of the invention.

FIG. 2 is a schematic circuit diagram of a programmable sub-integer N frequency divider circuit (100) according to an exemplary embodiment of the invention. In particular, FIG. 2 schematically illustrates an exemplary framework of a phases switched, rotator-based frequency divider circuit (100) that is designed to generate output signal frequencies having arbitrary fractional (sub-integer) division ratios of an input signal frequency, while eliminating output glitches and minimizing fractional spurs. Sub-integer refers to division ratios of, e.g., X.5, X.25, X.1, etc., where X is an integer. In general, the frequency divider (100) comprises a prescaler (110) with a division ratio (or divisor) A, a phase selector/rotator circuit (120), a post-scaler circuit (130) with a division) ratio B, and a modulus controller (140). The prescaler (110) receives an input signal $T_{IN}$ and divides the input signal $T_{IN}$ by A, where A can be any value, with typical values of 2 or 4. The output signal $T_A$ of the prescaler (110) includes differential quadrature signals, including differential in-phase signals (I) and (I–) and differential quadrature-phase signals (Q) and (Q–), which are input to the phase rotator (120). The quadrature signals I, Q, I– and Q– are sinusoidal signals of the same frequency but having phases shifted by 0, 90, 180 and 270 degrees, respectively.

The four phases are input to the phase rotator (120). The phase rotator (120) incrementally applies a positive or negative phase shift to the signal $T_A$ in response to control signals output from the modulus controller (140) by rotating to different phase states. In one exemplary embodiment of the invention, the phase rotator (120) is designed to perform phase interpolation to generate the desired output phases by interpolating between the differential I and Q input phases. In particular, as will be explained in further detail below, the phase rotator (120) may be constructed with a circuit topology that performs phase shifting by linearly combining I and Q signals in appropriate ratios in the current or voltage domain so as to achieve a desired phase shift resolution. For example, the phase rotator (120) can interpolate between the I and Q input phases to generate 4 different output phases such as I+Q, I–Q, –I–Q and –I+Q, thereby providing a phase shift resolution of π/2. The output of the phase rotator (120) is applied to the post-scaler (130) which has a division ratio B. The output of the post-scaler (130) clocks the modulus controller (140), thereby defining a control cycle for the phase rotator (120). The phase rotator (120) performs a phase rotation once every B periods of the phase rotator (120). The output of the frequency divider (100), $f_{Div}$ can be taken directly from the output of the post-scaler (130) or from some internal node in the modulus controller (140), depending on the framework of the modulus controller (140).

The phase rotator (120) applies a negative or positive phase, $k\Delta\phi$, the output signal $T_A$ (110) once every control cycle, where $\Delta\phi$ denotes a minimum phase shift possible from the phase rotator (120) and where k denotes a phase shift greater than the minimum phase shift. With the prescaler (110) at the input of the phase rotator (120), the equivalent phase shift is $Ak\Delta\phi$ with respect to the input signal $T_{IN}$, and defines the mantissa of the fractional divider (100) circuit, which is equal to $Ak\Delta\phi/2\pi$. The overall division ratio of the divider circuit (100) at the output of the modulus controller (140) may be represented as $N(k)=(AB+Ak\,\Delta\phi/2\pi)$, where AB denotes an integer portion of the divisor and where $Ak\Delta\phi/2\pi$ denotes the fractional portion or mantissa of the divisor. For the general architecture of FIG. 2, the fractional division ratio can be derived as follows.

The input signal to the prescaler (110) is a periodic signal having period $T_{IN}$, and the output signal of the pre-scaler (110) is a periodic signal having a period of $T_A$, and related to the input period as:

$$T_A = A \cdot T_{IN}. \tag{1}$$

The phase rotator (120) rotates the input signal $T_A$ by some preprogrammed minimum amount $\Delta\phi$. The phase rotator (120) is controlled by a clock signal with period $T_B$, which is output from the post scaler (130). The output signal $T_R$ of the phase rotator (120) is not periodic, but has a period $T_R$ that alternates between two values, where the period can be represented by a sequence, as follows:

$$T_R[n] = T_A\left(1 + k\frac{\Delta\phi}{2\pi}\right) \quad \text{for } n = \text{integer multiples of } B \tag{2}$$
$$= T_A \quad \text{for } n = \text{other}$$

In Equation 2, the variable n denotes the index of the $T_B$ clock period and k is a programmable parameter based on the modulus controller (140), where values of k may positive, negative, and zero. A value of |k|>1 indicates that the phase rotator (120) performs a phase adjustment by more than a minimum step size.

It should be noted that the phase rotator (120) can rotate in either angular direction. In one direction (referred to as "clockwise"), where the value of k is positive, the phase is rotated to counteract the counter-clockwise angular frequency of the input signal $T_A$, and thereby decrease the frequency of the signal (i.e., increase its output period). In the other direction (referred to as "counter-clockwise"), where the value of k is negative, the phase can be rotated to enhance the counter-clockwise angular frequency of the input signal, and thereby increase the frequency of the signal (i.e., decrease its output period). Since the phase rotator (120) can phase rotate the signal $T_A$ in either angular direction, the period $T_R$ of the output signal from the phase rotator (120)) can be either less than or greater than the period $T_A$ of the input signal to the phase rotator (120).

The output period $T_B$ of the post-scaler (130) is the sum of the input periods $T_R$, modulo B. For a fixed modulus input, the output signal period $T_B$ is strictly periodic. However, in one exemplary embodiment discussed below where the modulus is dynamically varied using, for example, program-swallow counters, the output signal period $T_B$ is not strictly periodic. In either case, the instantaneous output period, $T_B$, as a function of k is represented by:

$$T_B = \sum_{n=1}^{B} T_R[n] = T_A(B-1) + T_A\left(1 + k\frac{\Delta\phi}{2\pi}\right) = T_{IN}\left(AB + Ak\frac{\Delta\phi}{2\pi}\right). \tag{3}$$

The overall division ratio N(k) is:

$$N(k) = AB + Ak\frac{\Delta\phi}{2\pi}. \tag{4}$$

In Equation 4, AB denotes the integer value of the division ratio, while $(Ak\Delta\phi/2\pi)$ denotes the mantissa or fractional part of the division ratio. The mantissa can be rewritten in terms of the resolution or a "least significant bit" of the division ratio. In particular, Equation (4) can be rewritten in terms of the resolution of the phase rotator (120), whereby the minimum phase shift $\Delta\phi$ of an M-bit phase rotator can be denoted as:

$$\Delta\phi = \frac{2\pi}{2^M}. \tag{5}$$

Next, equation (4) can be further simplified by introducing a "least significant bit" of the division ratio, as follows:

$$N_{LSB} = A\frac{\Delta\phi}{2\pi} = \frac{A}{2^M}. \quad (6)$$

This results in the following expression for the division ratio:

$$N(k)=AB+N_{LSB}\cdot k. \quad (7)$$

In Equation 7, a value of |k| greater than 1 indicates that the phase rotator is shifting by more than its minimal step size. For practical purposes, there is a limit to the value of k so as to guarantee proper operation. For example, in the phasor domain, the available states from the rotator (120) can be represented as points evenly distributed around a circle, forming a $2^M$-sided polygon. As the phase rotator skips more and more intermediate states, the trajectory taken in the phasor domain moves closer to the origin, reducing the amplitude of the waveform. Eventually, the amplitude will become too small to trigger the subsequent limiter and dividers, resulting in erroneous operation. In an exemplary embodiment of the invention, the limit may be set to be a π/2 phase shift (i.e., 90 degree phase shift), where the M-sided polygon is reduced to a square.

Figure 15:
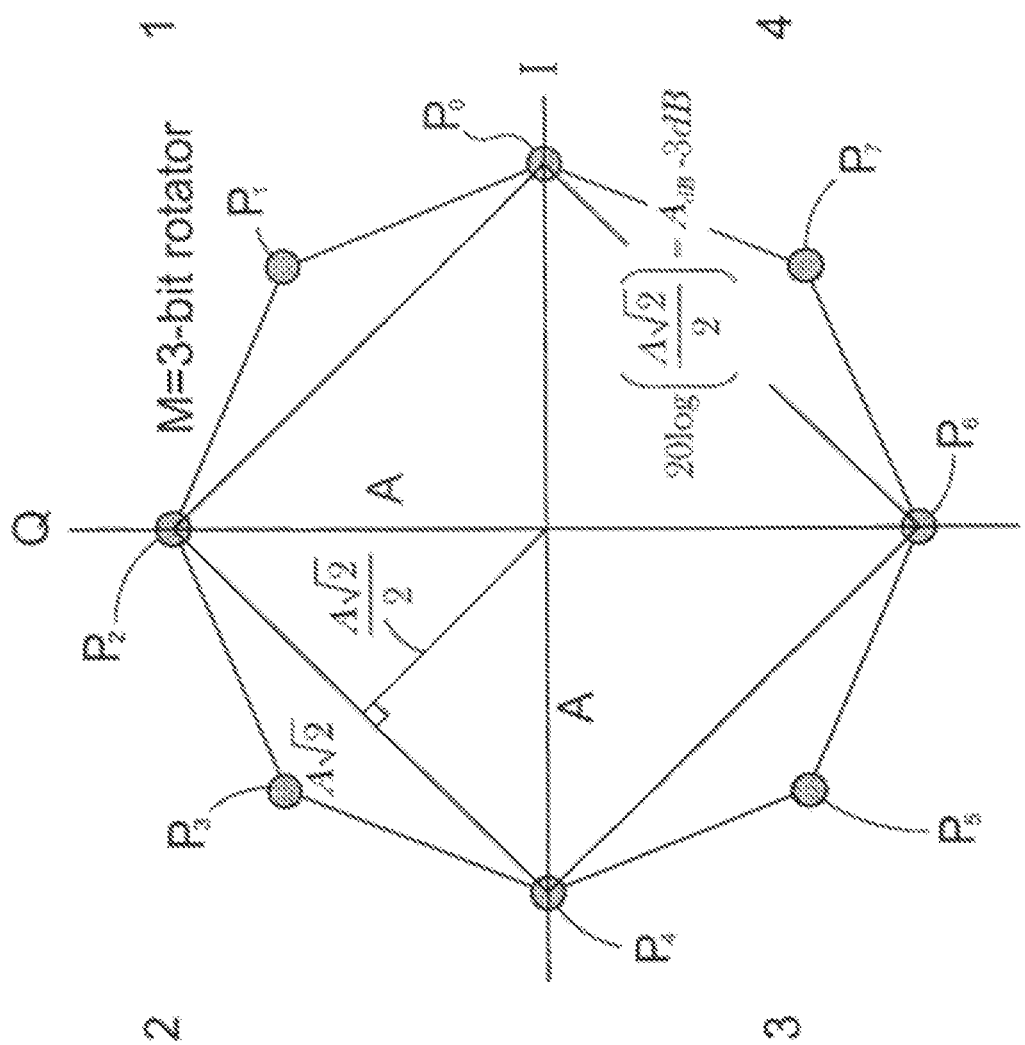
FIG. 15 is an exemplary IQ phasor diagram illustrating phase states for an m-bit phase rotator according to an exemplary embodiment of the invention.

For example, FIG. 15 is an exemplary phasor diagram of possible phasor rotator positions (P0~P7) for an M=3-bit phase rotator. In FIG. 15, each position P0~P7 represents one of $2^M$ phase states that are generated by the phase rotator. The minimum phase shift (Equ. 5) is $$\Delta\phi = \frac{2\pi}{2^M},$$

which is π/4 in the illustrative embodiment of FIG. 15. Essentially, skipping one phase state means that the next clock edge at the output of the phase rotator is delayed by a phase $$\Delta\phi = \left(\frac{2\pi}{2^M}\right) \cdot 2,$$

which is π/2 in the illustrative embodiment of FIG. 15. Referring to the input signal, this more generally corresponds to phase of $$k\frac{2\pi}{2^M}.$$

FIG. 15 illustrates the effect of skipping states on the output amplitude, where the maximum step size is limited to π/2, yielding a 3-dB decrease in voltage amplitude.

In the regard, for an M-bit phase rotator, the range of possible values for k can be denoted as:

$$|k| \le \frac{2^M}{4} = 2^{M-2}. \quad (8)$$

In general, based on the above equations, it can be shown that an M-bit phase rotator according to an exemplary embodiment of the invention can yield a multi-modulus frequency divider circuit, or more specifically, a $(1+2^{M-1})$-modulus divider. By way of example, a tri-modulus frequency divider according to an exemplary embodiment of the invention may be designed based on the exemplary phase-switch divider topology of FIG. 2, where the phase rotator (120) is implemented as a 2-bit rotator (M=2) and the divisor values of the dividers (110) and (130) are selected as A=2 and B=4, respectively. In this example, the values of k may be selected as {−1, 0, +1} (Equ. 8), resulting in Δϕ=π/2 (Equ. 5), $N_{LSB}$=0.5 (Equ. 6), and N={7.5/8/8.5} (Equ. 7), and thereby realizing a phase-switched tri-modulus divide-by-7.5/8/8.5 frequency divider circuit.

By way of further example, a nine-modulus frequency divider according to an exemplary embodiment of the invention may be designed based on the exemplary phase-switch divider topology of FIG. 2, where the phase rotator (120) is implemented as a 4-bit rotator (M=4) and the divisor values of the divider circuits (110) and (130) are selected as A=2 and B=4, respectively. In this example, the values of k may be selected as {−4,−3,−2,−1,0,1,2,3,4} (Equ. 8), resulting in Δϕ=π/8 (Equ. 5), $N_{LSB}$=0.125 (Equ. 6), and N={7.5, 7.625, 7.75, 7.875, 8, 8.125, 8.25, 8.375, 8.5} (Equ. 7), and thereby realizing a phase-switched nine-modulus divide-by-7.5/7.625/7.75/7.875/8/8.125/8.25/8.375/8.5 frequency divider circuit.

Figure 1:
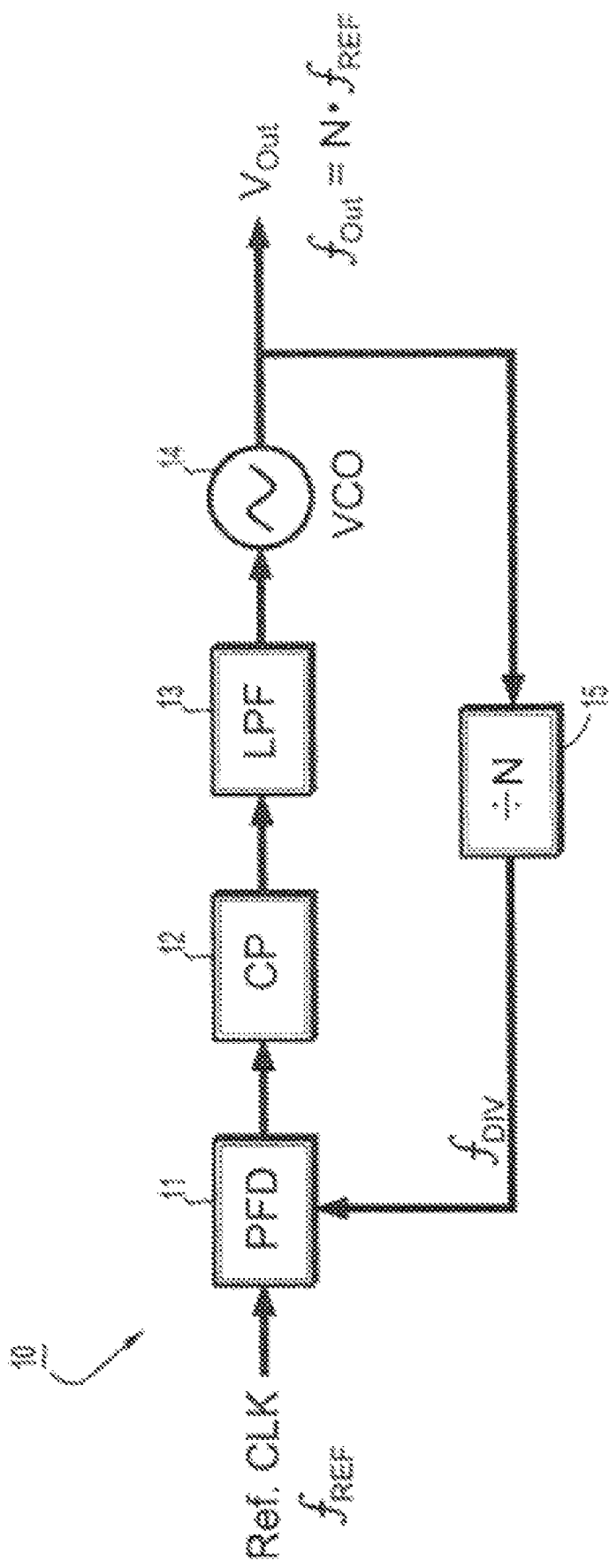
FIG. 1 is a block diagram illustrating a conventional phase-lock-loop frequency synthesizer.
Figure 3:
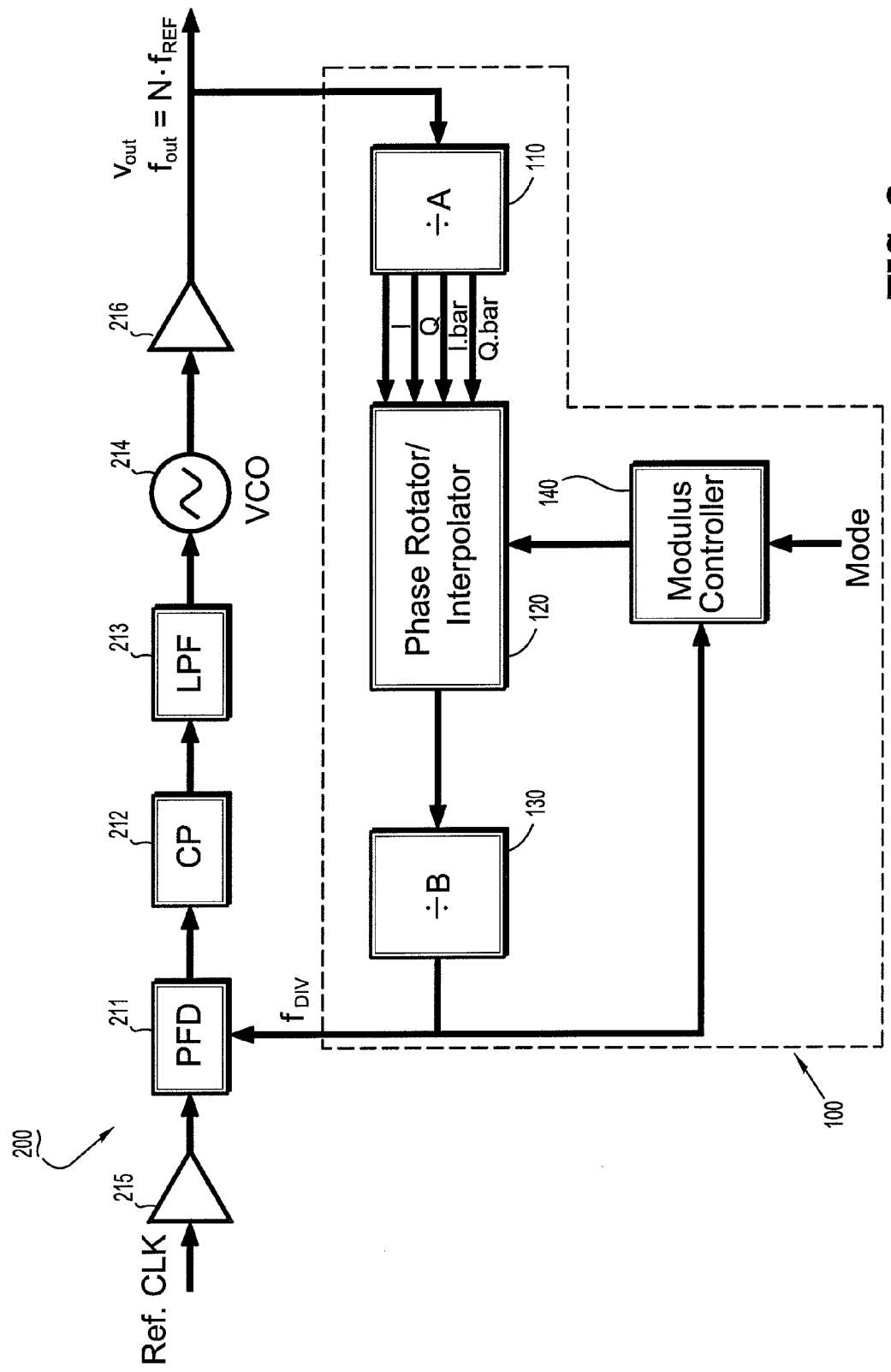
FIG. 3 is a block diagram of a phase-lock-loop frequency synthesizer according to an exemplary embodiment of the invention, which implements the sub-integer N frequency divider circuit.

It is to be appreciated that the programmable frequency divider circuit (100) may be implemented in various applications that require generation of output signal frequencies that have arbitrary sub-integer N division factors of an input (reference) signal frequency. By way of example, the exemplary frequency divider circuit (100) of FIG. 2 can be implemented with a phase-locked loop circuit to realize a sub-integer-N PLL frequency synthesizer circuit, such as depicted in FIG. 3. In particular, FIG. 3 schematically illustrates an extension to the exemplary PLL framework of FIG. 1 in which the N frequency divider (15) is implemented using the exemplary frequency divider (100) of FIG. 2. In particular, FIG. 3 is a high-level schematic illustration of a PLL frequency synthesizer circuit (200), which comprises an optional input buffer/amplifier (215), a PFD (phase-frequency detector) circuit (111), an optional charge pump (212), a loop filter (213), a VCO (voltage controlled oscillator) circuit (214), an optional output buffer amplifier (216) and the frequency divider (100) of FIG. 2 in a PLL feedback loop. The PLL (200) operates similar to the PLL (10) of FIG. 1 and a detailed explanation is not necessary. The output signal $V_{out}$ is feedback to the PFD (211) via the sub-integer N frequency divider circuit (100), which performs programmable sub-integer frequency division operations as discussed herein generate a low frequency signal $f_{Div}$, to achieve $f_{Ref}=f_{Div}$ where the PLL frequency synthesizer achieves the desired "locked" state.

It is to be noted that the exemplary frequency divider (100) in FIGS. 2 and 3 illustrates a generic framework in which phase shifting by the phase rotator (120) is controlled by the outputs of the modulus control circuit (140). Based on the teachings herein, one of ordinary skill in the art can readily envision various modulus control and phase switching/control circuit topologies that may be used to build a frequency divider circuit according to the exemplary framework in FIG. 2. For example, in one exemplary embodiment, the frequency divider circuit (100) may be implemented as a program swallowed phase-rotating divider using pulse swallowing techniques to realize phase shifting control. In other embodiments, the frequency divider circuit (100) can be implemented using intrinsic phase rotator topologies with finite state machines designed to realize dynamic multi-modulus divider functionalities and phase switching control.

Figure 4:
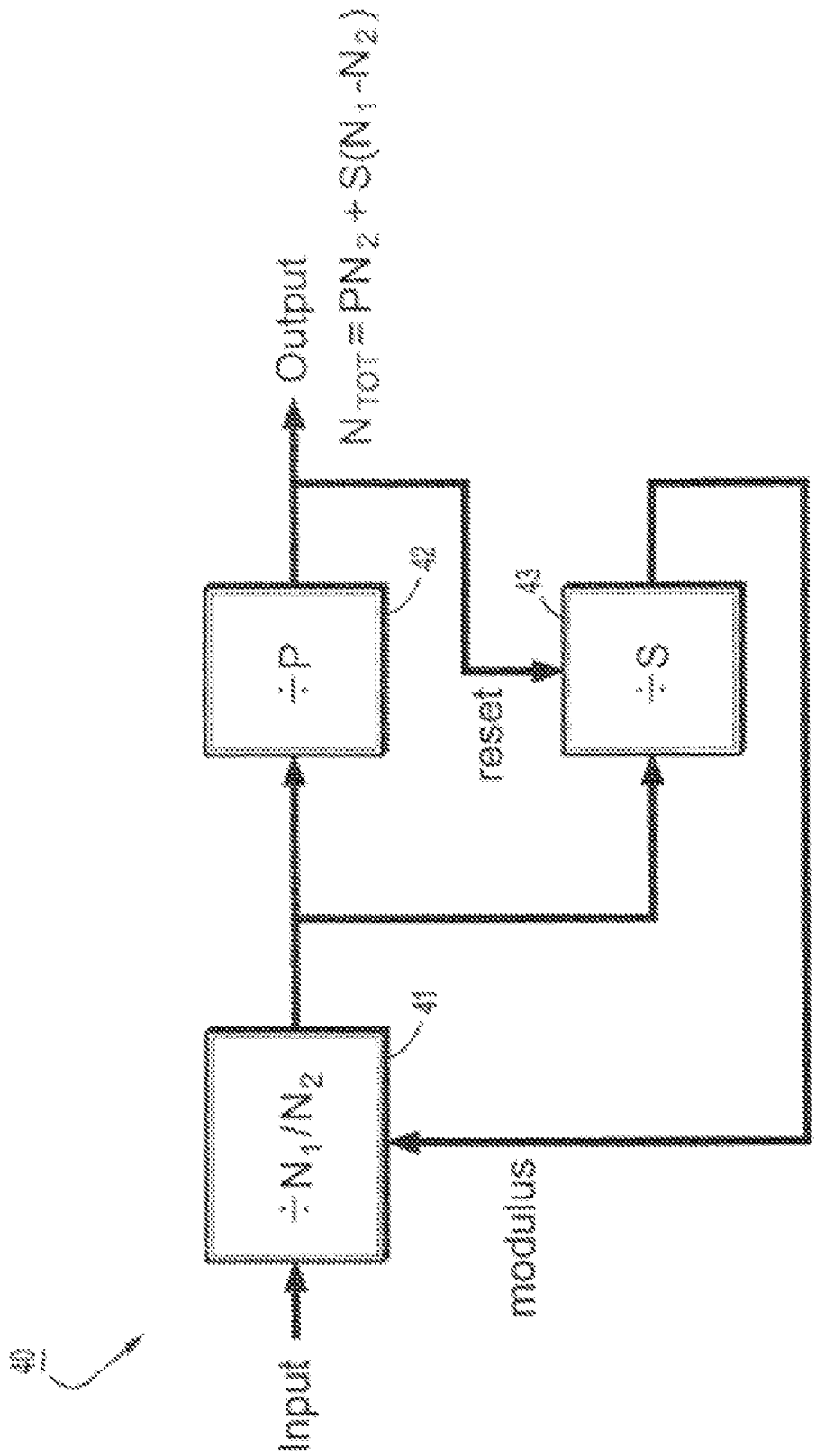
FIG. 4 schematically illustrates a general framework of a program-swallow counter circuit.
Figure 5:
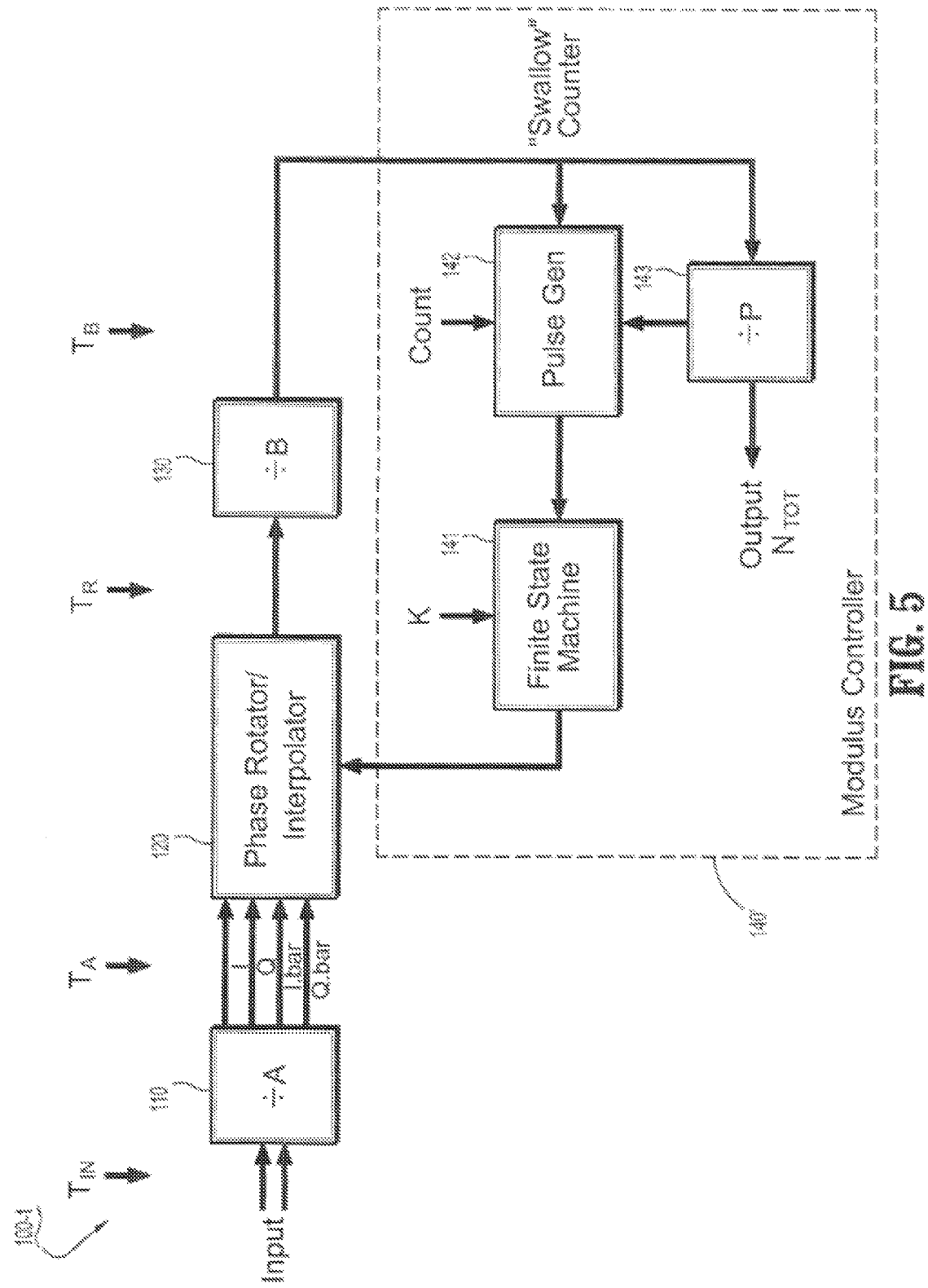
FIG. 5 schematically illustrates a program-swallowed phase rotating frequency divider circuit according to an exemplary embodiment of the invention, which is based on the program-swallow counter framework of FIG. 4.

By way of specific example, an exemplary framework for implementing a program-swallowed phase rotating frequency divider will now be discussed in further detail with reference to the exemplary embodiments of FIGS. 4 and 5. In particular, FIGS. 4 and 5 illustrate techniques to implement the modulus controller (140) of FIGS. 2 and 3 using a program-swallow counter framework to realize a multi-modulus divider with a wide range of possible sub-integer division ratios. FIG. 4 schematically illustrates a general framework of a program-swallow counter circuit (40) comprising a multi-modulus divider (41), a program (P) counter (42) and a swallow (S) counter (43). The swallow (S) counter is programmable from 0 to P. The program (P) counter (42) provides the final output signal which also serves to reset the S counter (43). The multi-modulus divider (41) divides an input signal by $N_1$ until the S counter (43) overflows, at which point the multi-modulus divider (41) divides the input signal by $N_2$. When the P counter (42) overflows, multi-modulus divider (41) divides the input signal by $N_1$, and the entire cycle starts again. With the general framework of FIG. 4, the final division ratio $N_{TOT}$ that is obtained for a given cycle is computed as $N_{TOT}=PN_2+S(N_1-N_2)$.

FIG. 5 schematically illustrates a program-swallowed phase rotating frequency divider circuit (100_1) according to an exemplary embodiment of the invention, which is based on the program-swallow counter framework of FIG. 4. The frequency divider circuit (100_1) is one exemplary embodiment of the frequency divider (100) of FIG. 2, with a specific implementation of a modulus controller (140') using a program-swallow counter framework. The modulus controller (140') comprises a rotator controller (141), a swallow counter (142), and a program counter (143). The S counter (143) may be implemented as a pulse generator and the phase controller (141) can be implemented as a finite state machine, using known techniques. The S counter (142) can be programmatically controlled by inputting a "count" value, which specifies the amount of pulses per output cycle that are generated and input to the phase controller (141). The phase controller (141) generates phase switching control signals that are clocked by the output of the S counter (142). The phase controller (141) selects between different values of k, which are programmable parameters. To obtain the finest phase switch resolution ($A\Delta\phi/2\pi$) by the phase rotator (120), the modulus controller (140') would select between two consecutive values of k (out of the set of possible moduli). The direction of phase rotation can be dynamically input to the phase controller (141) during operation.

With the exemplary modulus controller (140') in FIG. 5, the final division ratio $N_{TOT}$ at the output of the program counter (142) can be shown as:

$$N_{TOT} = \sum_{n=1}^{S} N(k_1) + \sum_{n=S+1}^{P} N(k_2) \qquad (9)$$
$$= P[N(k_2)] + S[N(k_1) - N(k_2)]$$

Furthermore, by plugging Equation (7) into Equation (9), we obtain:

$$N_{TOT} = P[AB + N_{LSB}k_2] + SN_{LSB}[k_1 - k_2] \qquad (10)$$
$$= ABP + N_{LSB}[Pk_2 + S(k_1 - k_2)]$$

Equation 10 is an expression of the wide range of arbitrary sub-integer division ratios that may be realized using an exemplary program-swallowed phase-switching frequency divider circuit such as depicted in FIG. 5. It is to be appreciated that various parameters in Equation 10 are programmable, such as the values $S$, $k_2$, $k_1$, and $P$. In FIG. 5, a control circuit (not shown) can be used to programmatically control the phase controller (141) (i.e., program k values) and the S counter (143) (i.e., program S). For instance, the values of $k_2$ and $k_1$ can be chosen to realize a wide range of possible division ratios. The resolution of the exemplary program-swallowed frequency divider is the difference between division ratios when S is incremented by one, which is found to be $A(k_1-k_2)/2^M$. To obtain the greatest resolution, the values of $k_2$ and $k_1$ are preferably selected such that $k_1-k_2=1$.

The range of possible values for $N_{TOT}$ (in Equ. 10) can be determined by substituting the possible values of k from Equation (8). With $k_1-k_2=1$, the maximum value of $N_{TOT}$ is when $k_1$ is maximum and S is equal to P. The minimum value of $N_{TOT}$ is when $k_2$ is minimum and S is zero. The resultant range of $N_{TOT}$ may be determined by:

$$AP\left(B - \frac{1}{4}\right) \le N_{TOT} \le AP\left(B + \frac{1}{4}\right). \qquad (11)$$

The total number of possible division ratios, R, can be determined by dividing the range of $N_{TOT}$ by $N_{LSB}$, namely:

$$R = 1 + \left[AP\left(B + \frac{1}{4}\right) - AP\left(B - \frac{1}{4}\right)\right] \cdot \frac{2^M}{A}. \qquad (12)$$
$$R = 1 + P \cdot 2^{M-1}$$

Figure 6:
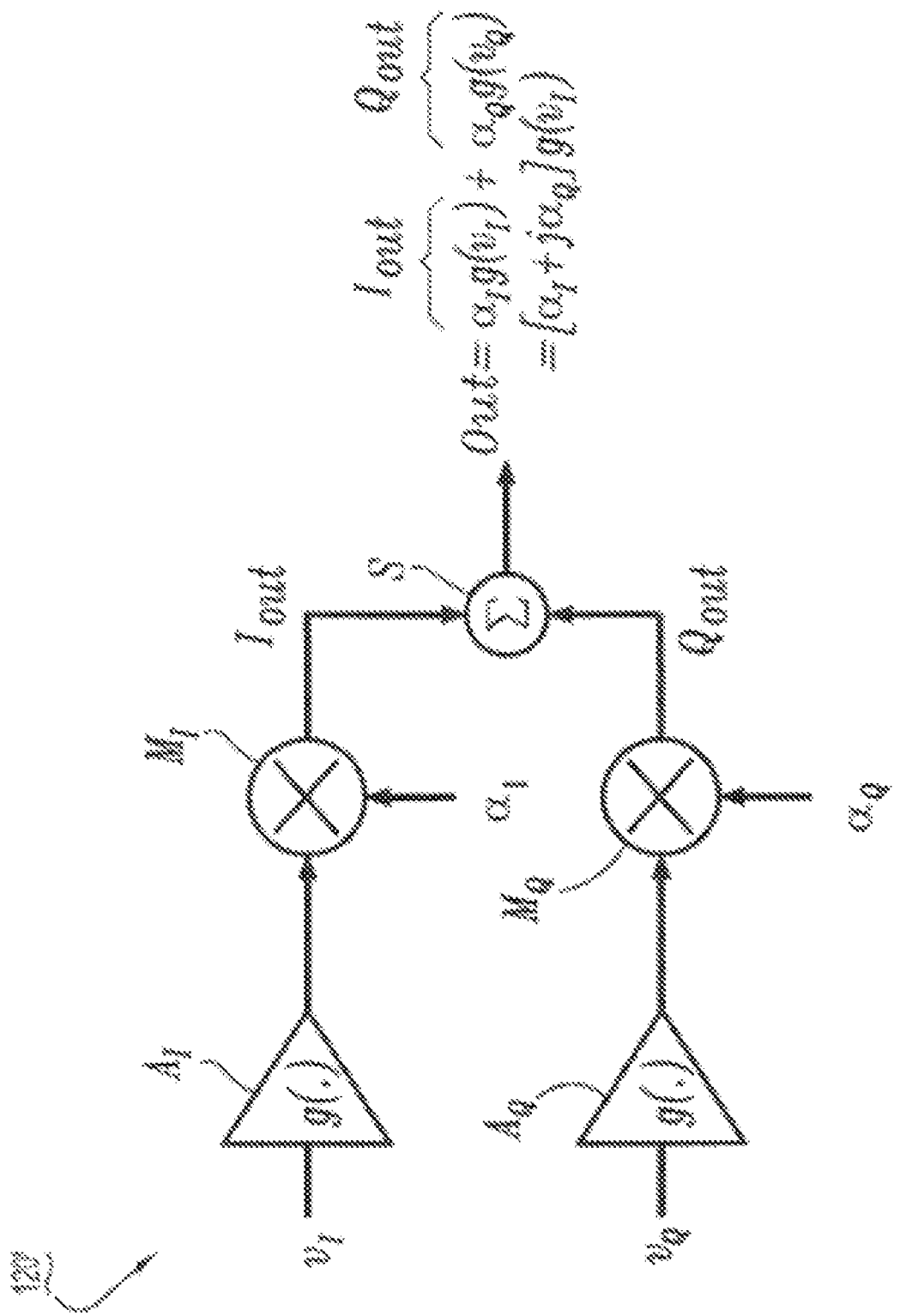
FIG. 6 depicts a general architecture of a phase rotator according to an exemplary embodiment of the invention to perform phase interpolation of the differential I and Q phase input signals.

It is to be noted that various circuit frameworks may be used to implement the phase rotator (120) of FIG. 2. In general, the phase rotator (120) is preferably implemented with an architecture that is capable of generating a plurality of phases (states) by interpolating between differential I and Q phases at the input to the phase rotator (120), whereby the differential I and Q input signals are linearly combined (summed) in the current or voltage domain with appropriate weights to achieve a desired phase shift. For example, FIG. 6 schematically illustrates a general frameworks of a phase rotator (120') according to an exemplary embodiment of the invention. The phase rotator (120') generally comprises an I-channel transconductance amplifier $A_I$ and multiplier $M_I$, a Q-channel transconductance amplifier $A_Q$ and multiplier $M_Q$, and a summing circuit S.

In general, FIG. 6 depicts a general architecture of a phase interpolator framework in which the phase rotator (120') performs phase interpolation of the differential I and Q phase input signals, $V_I$ and $V_Q$, based on control inputs $\alpha_I$ and $\alpha_Q$, which provide sign (+, −) control and which specify interpolation weighting factors, and then summing the differential I and Q input signals in the current or voltage domain with the appropriate weights to achieve a desired phase shift. The differential I and Q input signals are linearly combined (summed) in the current or voltage domain with appropriate weights to achieve a desired phase shift.

In the I-channel, the I-phase input phase signal (differential I phases) is amplified by the amplifier AI with a transconductance g that is controlled based on control input $\alpha_I$ to produce an output current $I_{out}=\alpha_I g(v_I)$. Similarly, in the Q-channel, the Q-phase input phase signal (differential Q phases) is amplified by the amplifier AQ with a transconductance g that is controlled based on control input $\alpha_Q$ to produce an output current $Q_{out}=\alpha_Q g(v_Q)$. The output of the phase rotator (120') is generated by linearly combining the I and Q channel output currents via the summing circuit S to output an interpolated output current signal $Out=\alpha_I g(v_I)+\alpha_Q g(v_Q)=[\alpha_I+j\alpha_Q]g(v_I)$.

In accordance with exemplary embodiments of the invention, the general phase rotator architecture of FIG. 6 may be used as a fundamental building block for implementing various phase rotators that can perform phase interpolation using a limited number of input phases (e.g., differential I and Q inputs), while obtaining a desired phase interpolation granularity (phase shift resolution) is obtained based on the number M of control bits and phase rotator circuit topology implemented to achieve a desired phase-shift resolution.

Figure 7:
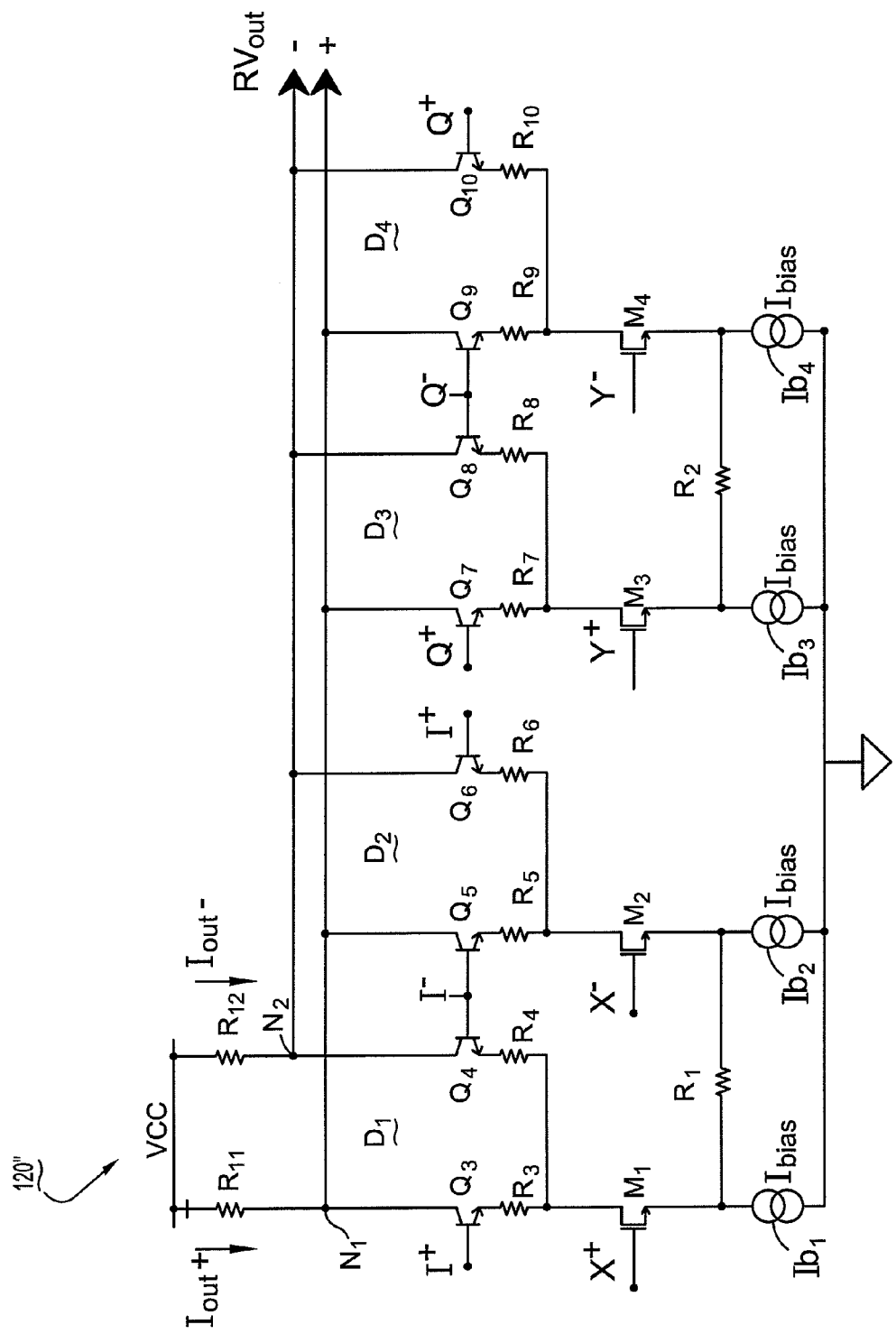
FIG. 7 is a schematic circuit diagram of a 2-bit phase rotator according to an exemplary embodiment of the invention, which is based on the conceptual phase interpolation framework of FIG. 6.

FIG. 7 is a schematic circuit diagram of a 2-bit phase rotator according to an exemplary embodiment of the invention. In particular, FIG. 7 illustrates a 2-bit phase rotator (120") having a framework that is based on the conceptual current-current-controlled phase interpolation framework of FIG. 6. The inputs to the phase rotator (120") include differential analog I and Q signals and differential digital X and Y control signals. The signal inputs ports I+, Q+, I- and Q- receive as input the I, Q, $\overline{I}$, $\overline{Q}$ (0°, 90°, 180°, 270°) phase input signals, respectively, as well as a 2-bit control signal applied as differential phase select control signals to control ports X+/X- and Y+/Y-. In general, the phase rotator (120") comprises four differential amplifiers D1~D4 formed, in part, by BJT (bipolar junction transistor) pairs (Q3/Q4), (Q5/Q6), (Q7/Q8) and (Q9/Q10) and corresponding emitter resistors R3/R4, R5/R6, R7/R8 and R9/R10.

The differential pairs (Q3/Q4) and (Q5/Q6) provide duplicate transconductance (amplification) stages for the differential amplifiers D1 and D2, where the differential I input phases are applied to the base terminals of transistors (Q3, Q4, Q5, and Q6) as shown. In particular, the I channel duplicate transconductor pairs (Q3-Q4) and (Q5-Q6) are wired such that the base terminals of Q3 and Q4 are connected to I+ and I-, respectively, and the base terminals of Q5 and Q6 are connected to I- and I+, respectively. Similarly, the differential pairs (Q7/Q8) and (Q9/Q10) provide duplicate transconductance (amplification) stages for the differential amplifiers D3 and D4, where the differential Q input phases are applied to the base terminals of transistors (Q7, Q8, Q9 and Q10) as shown. In particular, the Q channel duplicate transconductor pairs (Q7/Q8) and (Q9-Q10) are wired such that the base terminals of Q7 and Q8 are connected to Q+ and Q-, respectively, and the base terminals of Q9 and Q10 are connected to Q- and Q+, respectively.

The phase rotator (120") further comprise a plurality of current sources Ib1, Ib2, Ib3 and Ib4 that provide bias currents for the differential amplifiers D1, D2, D3 and D4. The current sources are connected to the differential pairs through corresponding NMOS transistors M1, M2, M3 and M4 which operate as switches that are controlled by the differential phase interpolation control signals X and Y. The switches M1 and M2 are controlled by differential phase control inputs X+ and X- such that only one of the differential amplifiers D1 and D2 for the different I input phases is enabled at any one time, and the switches M3 and M4 are controlled by the differential phase control inputs Y+ and Y- such that only one of the differential amplifiers D3 and D4 for the differential Q input phases is enabled at any on time. In other words, the differential phase select signals X and Y operate to control the switches M1, M2, M3 and M3 such that the phase rotator (120") will perform phase interpolation between an I phase signal and a Q phase signal to provide phase interpolated output currents $I_{out}$+ and $I_{out}$- flowing through output load resistors R11 and R12, respectively, and thereby convert the phase mixed output current signal to a differential output signal Vout on nodes N1 and N2.

Figure 8:
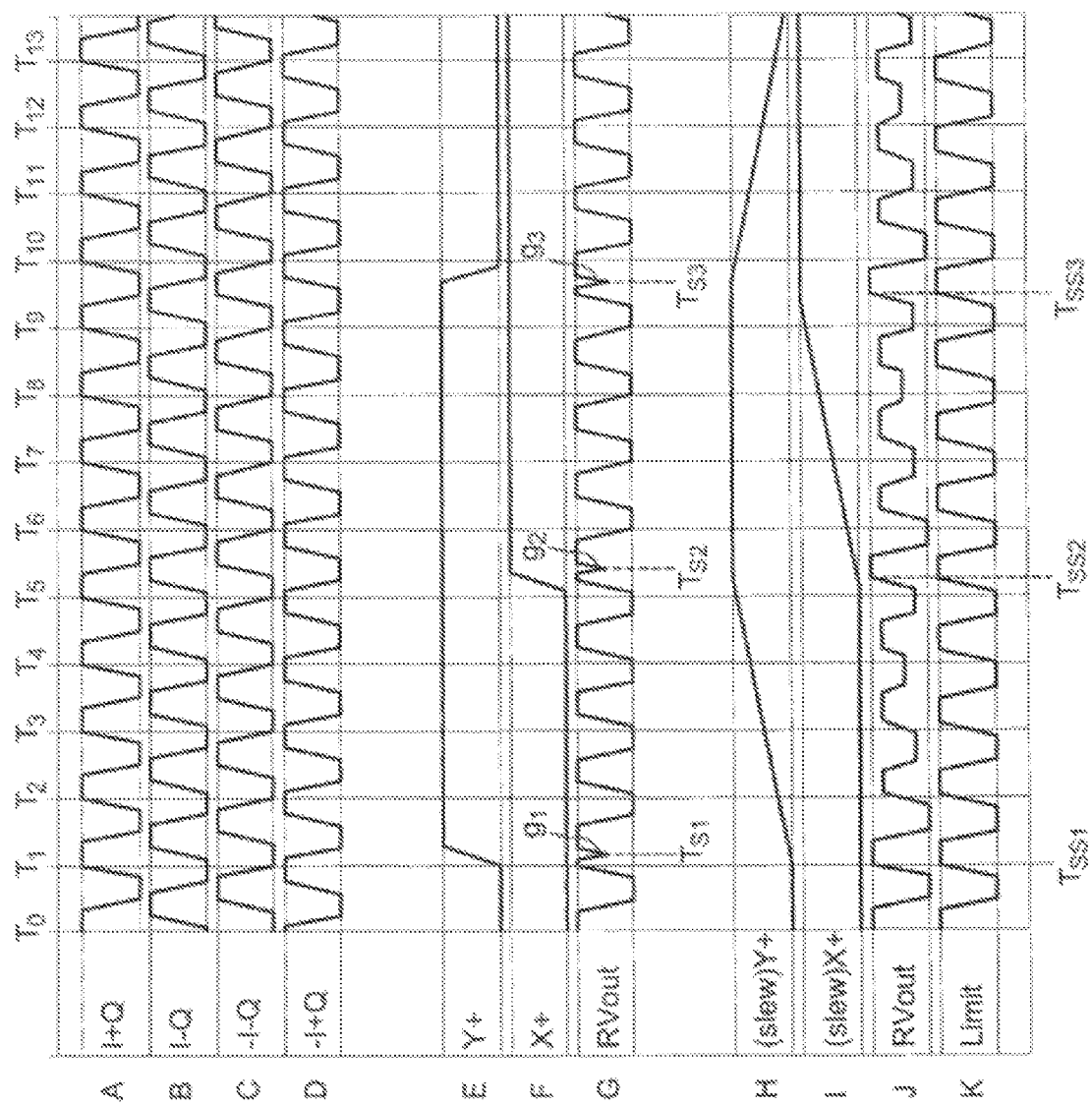
FIG. 8 is an exemplary waveform timing diagram illustrating exemplary modes of operation of the 2-bit phase rotator of FIG. 7.

An exemplary mode of operation of the phase rotator (120") of FIG. 7 will now be discussed in further detail with regard to FIG. 8. In particular, FIG. 8 is an exemplary waveform timing diagram to illustrate a phase rotation and interpolation operation of the phase rotator of FIG. 7. In FIG. 8, a plurality of waveforms A, B, C and D represent a corresponding one of the output phases of the phase rotator, namely, I+Q, I-Q, -I+Q, and -I-Q, respectively. The waveforms A, B, C and D are presented over period from time T0~T13 covering 13 full cycles of each signal. It is to be noted that the waveforms are depicted as being trapezoidal-shaped waveforms for simplicity, although in practice the input signals would be more sinusoidal.

Waveforms E and F illustrate exemplary phase interpolation control signals Y and X that are applied to the respective Y+ and X+ control inputs of the phase rotator (120") (FIG. 7) over the time period T0~T13. And waveform g illustrates the output signal RVout of the phase rotator (120"), which is generated over the time period T0-T13 as a result of the phase interpolation control signals X and Y. The phase rotator (120") rotates to a next phase state on rising and falling edges of the phase interpolation control signals.

FIG. 8 illustrates output waveform $RV_{out}$ of the phase rotator (120") (FIG. 7) over the time period T0~T13, which rotates to successive phase states I+Q→I-Q→-I-Q→-I+Q in a clockwise direction at certain times according to the logic states of the differential phase interpolation control signals X and Y applied to the switches M1, M2, M3 and M4. The following Table I illustrates the output phase of the phase rotator (120") based on the logic levels of the X and Y signals applied to the phase interpolation control ports X+, X-, Y+ and Y- of the phase rotator (120") in FIG. 7.

TABLE I

| X+ | X- | Y+ | Y- | $RV_{Out}$ |
|---|---|---|---|---|
| L | H | L | H | I + Q |
| L | H | H | L | I - Q |
| H | L | H | L | -I - Q |
| H | L | L | H | -I + Q |

As depicted by waveforms E and F in FIG. 8, at time t0, the differential phase control signal is generated such that a logic "0" is applied to the Y+ and X+ control ports. Although not depicted in FIG. 8, a logic level "1" is applied to the X- and Y- phase interpolation control ports. As a result, referring to FIG. 7, switches M2 and M4 are "On" providing bias current to enable differential amplifiers D2 and D4, while switches M1 and M3 are "Off" to disable differential amplifiers D1 and D3. As a result, the output current $I_{out}$+ is equal to the sum of collector currents of Q5 and Q9, and the output current $I_{out}$- is equal to the sum of the collector currents of Q6 and Q10. Therefore, voltage at output node N1 is an amplified signal of the sum of the +I and +Q input phases (the differential output RVout is I+Q). Therefore, as shown in FIG. 8, the output waveform G is the waveform A between T0 and T1.

Next, at time T1, the differential phase control signal applied to Y+ begins to transition from Low to High during the period between T1 and T2. In this state, a logic "1" is applied at the Y+ and X− control ports, while a logic "0" is applied to the Y− and X+ control ports. As a result, referring to FIG. 7, switches M2 and M3 are "On" providing bias current to enable differential amplifiers D2 and D3, white switches M1 and M4 are "Off" to disable differential amplifiers D1 and D4. As a result, the output current $I_{out}+$ is equal to the sum of collector currents of Q5 and Q7, and the output current $I_{out}-$ is equal to the sum of the collector currents of Q6 and Q8. Therefore, voltage at output node N1 is an amplified signal of the sum of the +I and −Q input phases (the differential output RVout is I−Q). Therefore, as shown in FIG. 8, the output waveform g switches from waveform A to waveform B at time Ts1.

Next, at time T5, the differential phase control signal applied to X+ begins to transition from Low to High during the period between T5 and T6. In this state, a logic "1" is applied at the Y+ and X+ control ports, while a logic "0" is applied to the Y− and X− control ports. As a result, referring to FIG. 7, switches M1 and M3 are "On" providing bias current to enable differential amplifiers D1 and D3, while switches M2 and M4 are "Off" to disable differential amplifiers D2 and D4. As a result, the output current $I_{out}+$ is equal to the sum of collector currents of Q3 and Q7, and the output current $I_{out}-$ is equal to the sum of the collector currents of Q4 and Q8. Therefore, voltage at output node N1 is an amplified signal of the sum of the −I and −Q input phases (the differential output RVout is −I−Q). Therefore, as shown in FIG. 8, the output waveform G switches from waveform B to waveform C at time Ts2.

Next, during the period between T9 and T10, the differential phase control signal applied to Y+ begins to transition from High to Low. In this state, a logic "0" is applied at the Y+ and X− control ports, while a logic "1" is applied to the Y− and X+ control ports. As a result, referring to FIG. 7, switches M1 and M4 are "On" providing bias current to enable differential amplifiers D1 and D4, while switches M2 and M3 are "Off" to disable differential amplifiers D2 and D3. As a result, the output current $I_{out}+$ is equal to the sum of collector currents of Q3 and Q9, and the output current $I_{out}-$ is equal to the sum of the collector currents of Q4 and Q10. Therefore, voltage at output node N1 is an amplified signal of the sum of the −I and +Q input phases (the differential output RVout is −I+Q). Therefore, as shown in FIG. 8, the output waveform G switches from waveform C to waveform D at time Ts3.

In the above example, the phase rotator (120") rotates to a next phase state an rising and falling edges of the phase interpolation control signals. As depicted in FIG. 8, since the control signals are not properly aligned with the I/Q signals, glitches g1, g2 and g3 occur in the output signal RVout at each phase transition time Ts1, Ts2 and Ts3. These glitches are not desirable for various reasons. For example, such glitches can propagate into timing errors further downstream. A primary cause of misalignment is due to the face that the circuit generating the control signals operates asynchronously with respect to the I/Q signals. Therefore, once cannot be sure of the state of the input signals when a transition occurs. Various methods may be used to prevent glitches in due to the phase transition. For example, one solution is to "re-time" the control signals using the differential I and Q phase inputs using known techniques. These solutions, however, are costly in terms of large power consumption and amount of silicon real estate needed to implement re-timing circuits.

A more practical approach to preventing glitches in the output signal of the phase rotator is to implement a slewing functionality that enables the phase rotator to gradually shift from one state to the next. Slewing from one state to the next means, for example, switching smoothly from I+Q to I−Q. This can be achieved by gradually turning the Q current off and back on again, transitioning from I+Q, to I, to I−Q. In one exemplary embodiment of the invention, a glitch free output may be realized by controlling the rise and fall times (slew rates) of the phase interpolation control voltages X and Y at the gate terminals of the switches M1, M2, M3 and M4 so that a gradual switching between the two polarities at the differential control inputs is realized.

For example, in the exemplary embodiment of FIG. 7, the transition time between the two polarities at the control inputs X+/X− and Y+/Y− can be controlled by the transconductance of the current switches M1/M2 degenerated by resistor R1 and the by the transconductance of the current switches M3/M4 degenerated by resistor R2. Moreover, switching can be further controlled by adding RC filter networks to the input driving networks for control inputs X+/X− and Y+/Y− (e.g., at the gates of M1~M4), which are designed with the appropriate time RC time constants to achieve a given slew rate, as is understood by those of ordinary skill in the art. With such methods, however, the slew rate control is integrated within the framework of the phase rotator resulting in a more complex architecture and making the phase rotator less application independent.

Figure 9:
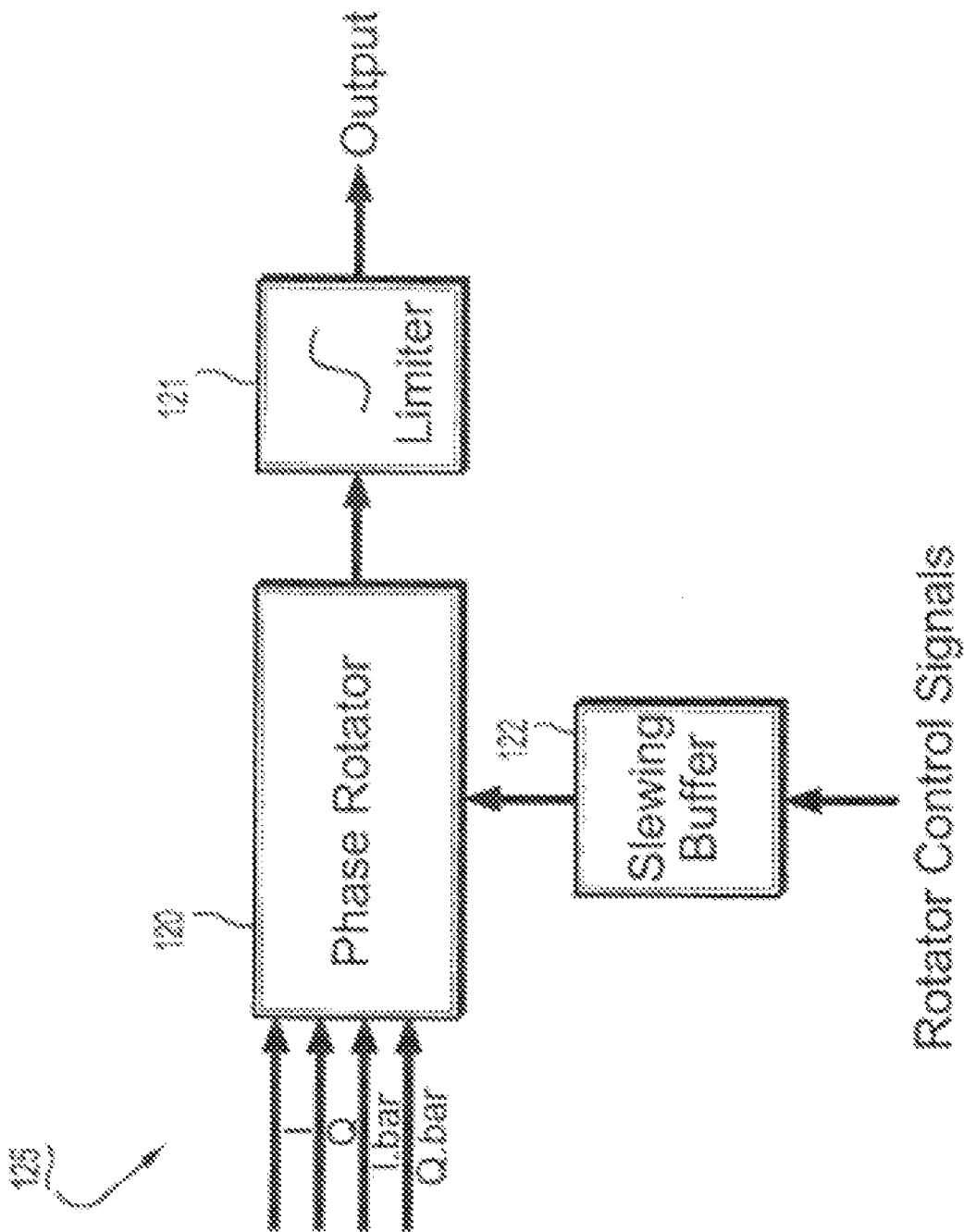
FIG. 9 is a schematic diagram of a slewing phase rotator according to an exemplary embodiment of the invention.

In accordance with exemplary embodiments of the invention, M-bit phase rotators may be implemented with a slewing control functionality to realize a smooth transition from one state to the next when performing a phase transition using slew rate control techniques that are essentially independent of the specific phase rotator topology. FIG. 9 schematically illustrates a slewing phase rotator circuit (125) according to an exemplary embodiment of the invention, which may be implemented in the exemplary embodiments of the frequency divider circuits of FIGS. 2 and 5. In general, the slewing phase rotator circuit (125) comprises a phase rotator (120), an output limiter (121) and a slewing buffer (122). The phase rotator (120) may be implemented using the circuit architectures discussed above with reference to FIGS. 6 and 7.

The limiter (121) and slewing buffer (122) operate in conjunction with the phase rotator (120) to implement a phase rotating slewing functionality that enables the phase rotator (120) to gradually transition from one phase state to the next. In general, the stewing buffer (122) operates to delay or otherwise increase the slew rate (rise time) of phase switch control pulses that are output from, e.g., the modulus controller (140) (FIG. 2) or rotator controller (141) (FIG. 5) so as to obtain a glitch free output signal from the phase rotator (120). The limiter (121) operates to maintain a constant amplitude of the output signal from the phase rotator (120) by compensating for decreases in the amplitude of the output signal of the phase rotator (120) which may occur by virtue of performing phase shifting with slewed control signals.

The slewing buffer (122) can be implemented using circuits and methods wall-known to those of ordinary skill in the art to realize a fixed or programmable slew rate control functionality. For example, the slewing buffer (122) can be implemented using a differential amplifier with a capacitive load, where the capacitance is selected to realize a desired slew rate based on the range of operating frequencies for the intended application. The capacitive load may be implemented using a programmable capacitor (e.g., varactor) to enable a programmatic slew rate control using known techniques. Moreover, the limiter (121) may be implemented using known circuit architectures that are suitable for the intended application.

An exemplary mode of operation of the slewing phase rotator circuit (125) of FIG. 9 will be discussed with reference to FIGS. 7 and 8, assuming that the phase rotator (120") in FIG. 7 is implemented as the phase rotator (120) in FIG. 9, and that the control signal waveforms E and F as illustrated in FIG. 8 are input the slewing buffer (122) to generate corresponding slewed control signal waveforms H and I (as illustrated in FIG. 8) The slewed control signal waveforms H and I allow for gradual shifting from one state to the next. In FIG. 8, waveform J illustrates the phase rotator output RVout over time T0~T13, where the output switches from waveform A to waveform B at time Tss1, from waveform B to waveform C at time Tss2 and from waveform D to waveform A at time Tss3. As compared to the output waveform G, the slewed control signals of waveforms H and I prevent glitches from being generated in the output waveform J at the phase state switches.

The slewed control signal waveforms H and I allow the output to switch smoothly from I+Q to I−Q, for example by gradually turning the Q current off and back on again, transitioning from I+Q, to I, to I−Q. As depicted by the phase rotator output waveform J in FIG. 8, the slewing control results in the output signal amplitude being decreased by 1.4 or 3 dB. The reason for this amplitude decrease can be illustrates in phasor notation, as follows:

$$I = A\cos(\omega t). \quad (12)$$

$$Q = A\cos\left(\omega t - \frac{\pi}{2}\right). \quad (13)$$

$$I + Q = \sqrt{2}\, A\cos\left(\omega t - \frac{\pi}{4}\right). \quad (14)$$

As the phase rotator output transitions from I+Q to I−Q, passing through I, the output amplitude changes from 1.414A to A and back to 1.414A again, resulting in a 3-dB drop (see, e.g., FIG. 15). The limiting amplifier (121) at the output of the phase rotator (120) in FIG. 9 operates to compensate for the decrease in amplitude. For example, in FIG. 8, the output waveforms J of the phase rotator is input to the limiter (121) and the limiter (121) restores the phase rotator output waveform J to its proper level, yielding a glitch less constant-envelope signal represented by waveform K in FIG. 8. As the number of bits in the rotator increases, the need for slewing control to avoid glitches goes down.

It is to be noted that the exemplary embodiment in FIG. 7 merely illustrates one exemplary embodiment of a 2-bit phase rotator designed to perform phase interpolation between differential I Q signals to achieve 4 different output phases I+Q, I−Q, −I+Q, and −I−Q, providing a phase shift resolution of 90 degrees between phase states. It should be noted that in this example, 4 different output phases (M=2) can be achieved simply using the differential IQ signals, where a phase multiplexer can be used to sequentially select and output each of the different I Q input phases 0, 90, 180 and 270, to achieve a phase shift resolution of 90 degrees. However, this technique can result in fractional spurs due to imprecise quadrature accuracy of the differential IQ phase signals input to the phase rotator. To mitigate fractional spurs, phase rotators according to exemplary embodiments of the invention are preferably implemented such that every phase signal output from the phase rotator is generated by interpolation between the input I and Q phases. This, results to calibrate the quadrature relationship and therefore, realize fractional division with very small fractional spurs.

The exemplary 2-bit rotator framework of FIG. 7 can be extended based on the conceptual framework of FIG. 6 to realize higher phase shift granularity using the differential IQ inputs (4 input phases) by increasing the number of control bits to adjust the ratio of bias currents in the I and Q channel differential amplifiers and generate more phase states based on the relative weighting of the differential output signal. For instance, in FIG. 7, the differential control signals X and Y (two bit resolution) provide switch control to connect the current sources in each of the IQ branches to an appropriate I and Q-channel differential amplifier to thereby phase interpolate (linearly combine) one of each of the I and Q phase input signals, and thereby generate output signals with phase states of 45, 135, 225, and 315. Given the symmetry of the differential transistor pairs, output resistive loads and current sources, the differential amplifiers that are enabled in the I and Q channels will have the same bias currents, and thereby generate differential I and Q outputs having equal weights (in terms of magnitude), but having different polarities to generate a desired output phase in the phase quadrant specified by the control signals.

It is to be appreciated that the exemplary phase rotator embodiment of FIG. 7 could be extended to include variable current sources in the I and Q channel branches, wherein control bits can be applied to enable/disable the I/Q differential amplifiers to select one of the I and Q inputs phases for interpolation, while using the remaining bits as control inputs to control the variable current sources and selectively vary the bias currents for the enabled differential amplifiers, for the purpose of generating I and Q differential outputs that are weighted relative to each other in proportion to the weighted bias currents. In the embodiment of FIG. 7, each of the current sources can be implemented as bias currents (current digital-to-analog converters), which generate a bias current that varies based on the digital control bit values, as is known in the art.

Alternatively, it is to be appreciated that another exemplary phase rotator embodiment of FIG. 7 can be extended to arbitrary phase resolution by replacing control signals X+, X−, Y+, and Y− with analog signals which are used to weight the currents and therefore realize phase interpolation. In this case, the current sources Ib1, Ib2, Ib3, and Ib4 are fixed, while their weights are controlled by analog signals X+, X−, Y+, and Y−.

Figure 10:
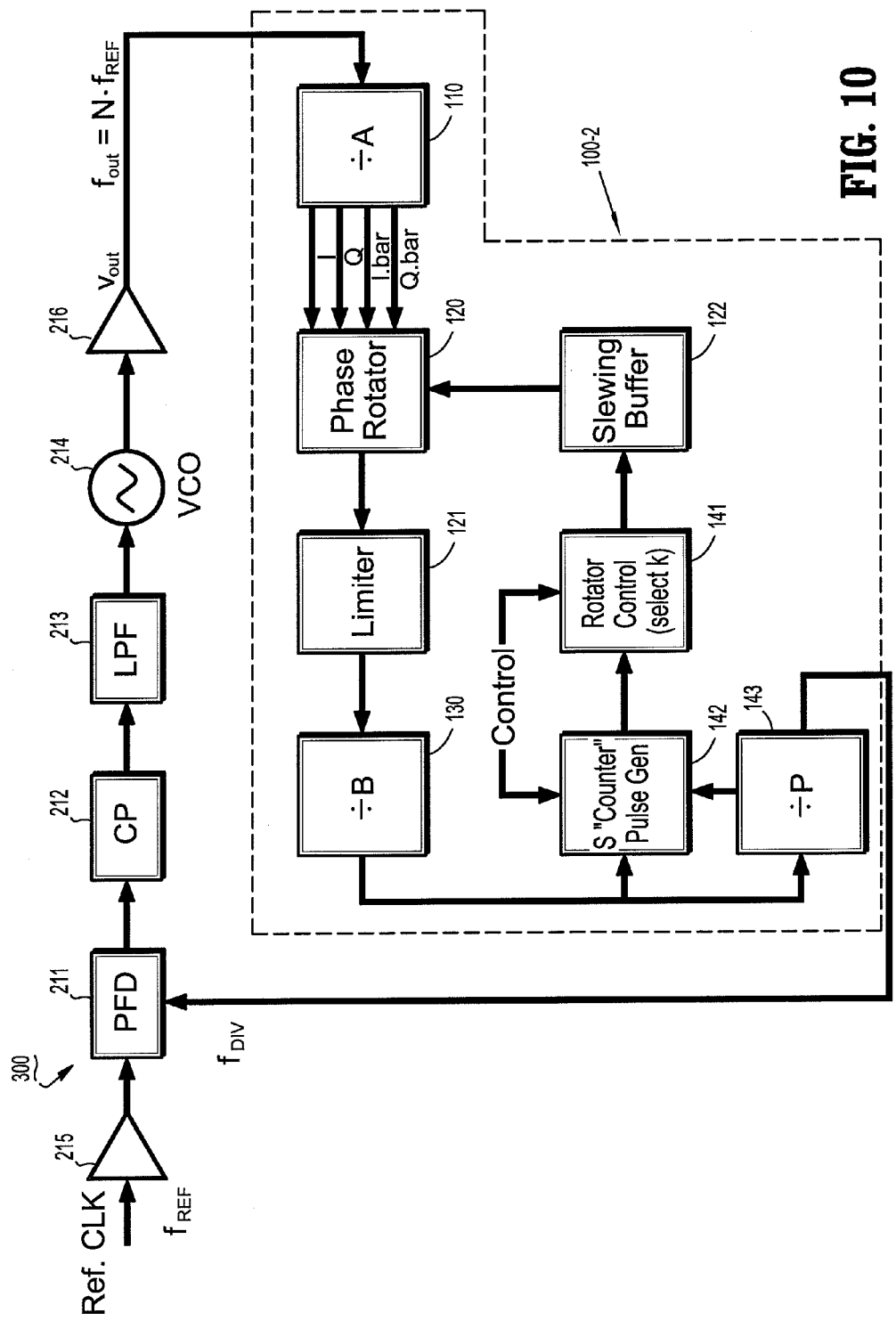
FIG. 10 is a block diagram of a phase-lock-loop frequency synthesizer according to another exemplary embodiment of the invention, which implements a program swallowed, phase-switched sub-integer N frequency divider circuit with slewing control functionality.

FIG. 10 is a schematic circuit diagram of a sub-integer-N frequency synthesizer circuit (300) according to another exemplary embodiment of the invention, which is similar to the frequency synthesizer (200) of FIG. 3, but having a sub-integer N frequency divider circuit (100_3) which incorporates a slewing phase rotator framework together with a program-swallowed controlled multi-modulus divider. FIG. 10 depicts a general framework in which slewing control may be implemented depending on the number M of bits of the phase rotator. As noted above, a slewing phase rotator may be implemented using the phase rotator (120), slewing buffer (122) and limiter (121), wherein the rotator controller (141) outputs control signals that are slewed by the stewing buffer (122). The program counter (143), swallow counter (142), and rotator controller (141) provide an exemplary architecture for a multi-modulus controller.

Figure 11:
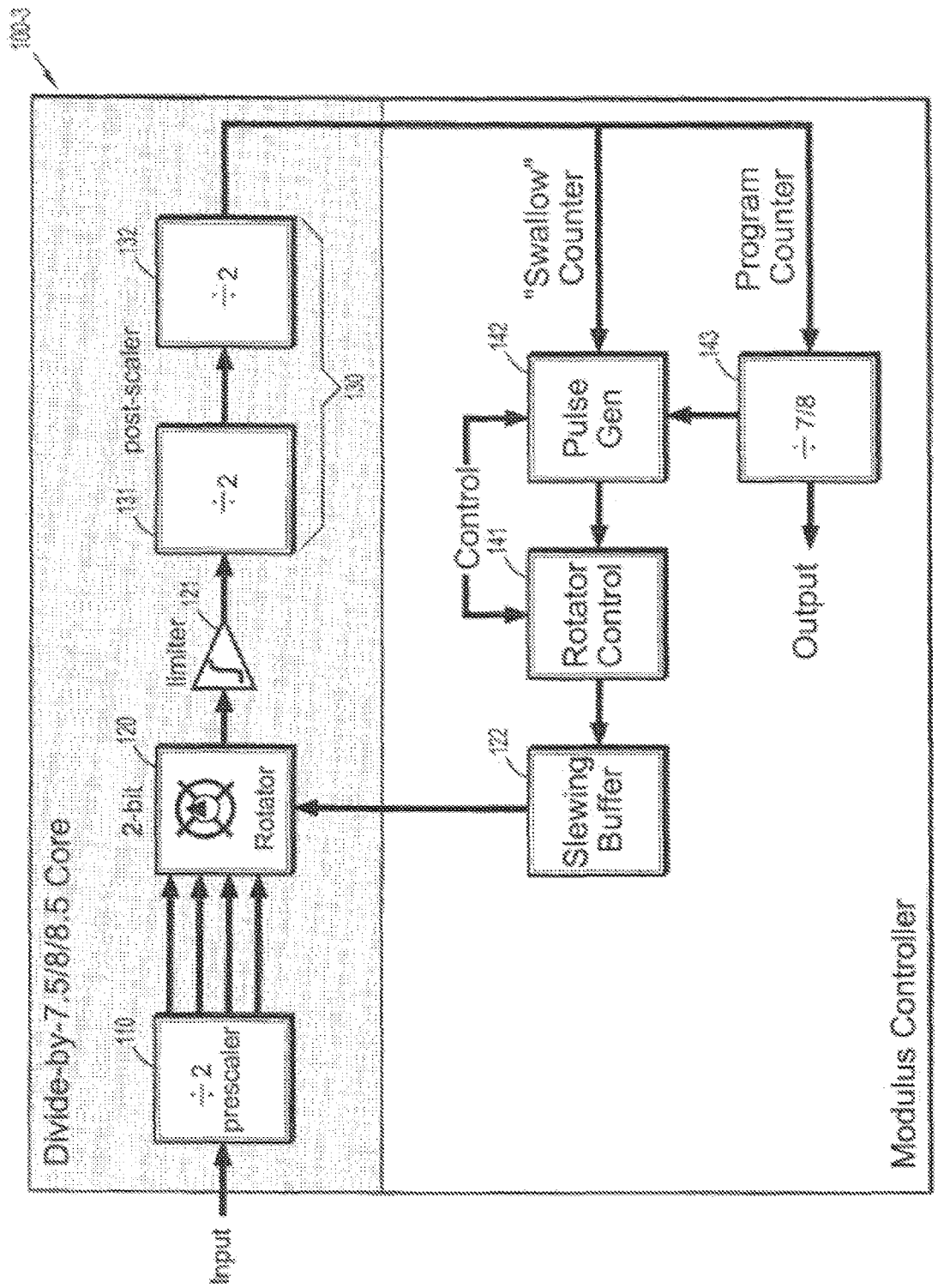
FIG. 11 schematically illustrates a program-swallowed, phase-switched sub-integer N frequency divider circuit with slewing control functionality, according to an exemplary embodiment of the invention.

FIG. 11 is a schematic illustration of a sub-integer-N frequency divider (100_3) according to another exemplary embodiment of the invention. In particular, FIG. 11 illustrates an exemplary embodiment of the frequency divider (100_2)

of FIG. 10, which is designed as a programmable divide-by-7.5/8/8.5 tri-modulus divider with divider values from 52.5 to 68 in half-integer steps, where the parameters are A=2, B=4, M=2, P=7 or 8, and S is programmable from 0 to P. The frequency divider (100_3) comprises divide-by-2 prescaler (110), a 2-bit phase rotator (120) with slewing control supported by the limiter (121) and slewing buffer (122), a divide-by-4 post scaler (1310) (formed by two divide-by-2 counters (131, 132)), a modulus controller implemented with a rotator controller (141) and program-swallow control where the program counter (143) is a divide-by-7/8 counter, while the swallow counter (142) is a pulse generation circuit which generates from zero to 7 or 8 pulses for the rotator controller (141). The rotator controller (141) selects the particular values of k.

FIG. 12 is an exemplary table diagram which illustrates possible division ratio values for the exemplary embodiment of FIG. 11, based on Equations 6 and 10, for example. In this example, the sub-integer N frequency divider (100_3) is a programmable divide-by-7.5/8/8.5 tri-modulus divider with divider values from 52.5 to 68 in half-integer steps. In this example, the resolution is 0.5, while the range is 52.5 to 59.5 for P=7 and 60.0 to 68 for P=8.

Figure 13:
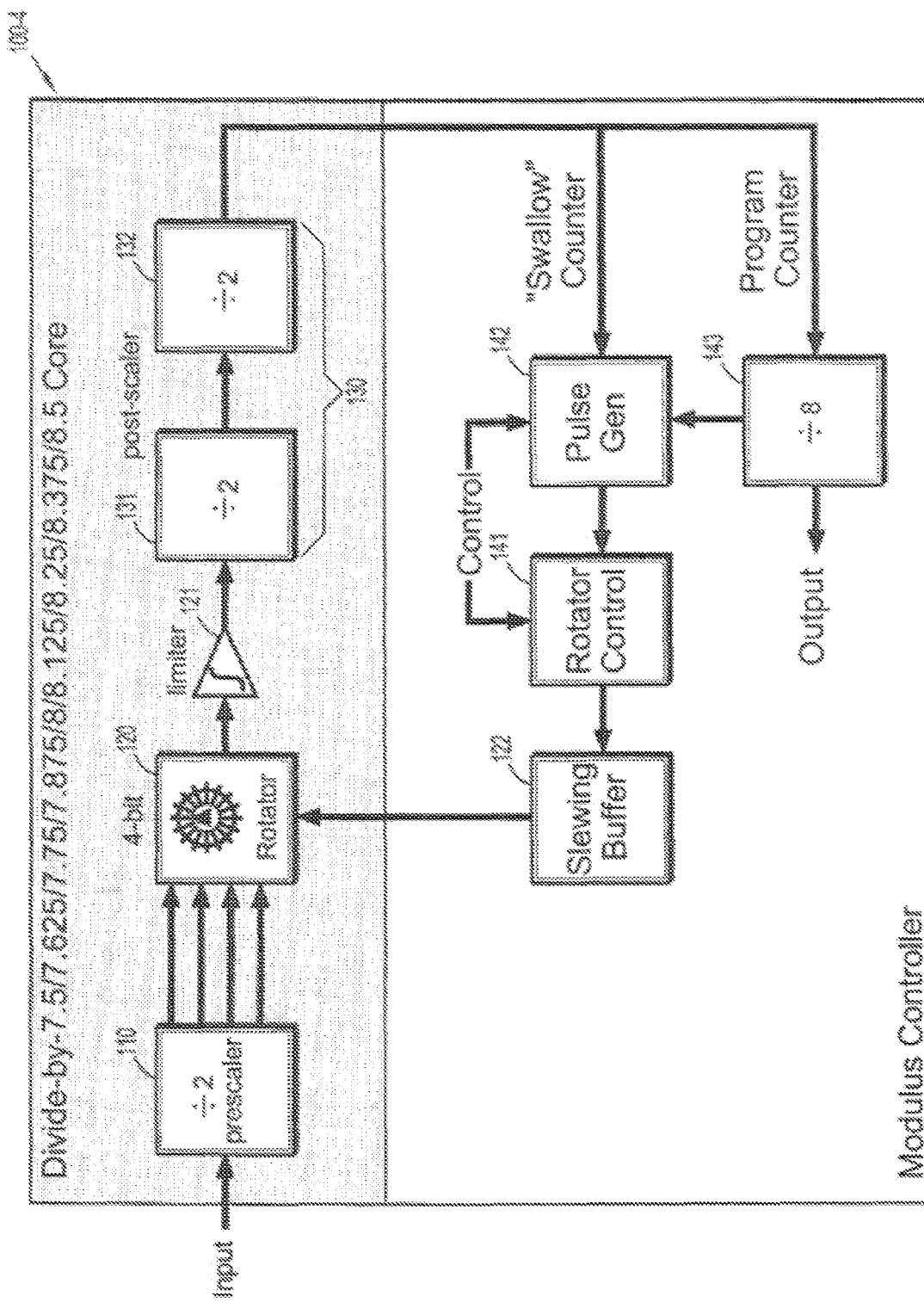
FIG. 13 schematically illustrates a program-swallowed, phase-switched sub-integer N frequency divider circuit with slewing control functionality according to another exemplary embodiment of the invention.

FIG. 13 is a schematic illustration of a sub-integer-N frequency divider (100_4) according to another exemplary embodiment of the invention. In particular, FIG. 13 illustrates an exemplary embodiment of the frequency divider (100_2) of FIG. 10, which is designed as a programmable nine-modulus divide-by-7.5/7.625/7.75/7.875/8/8.125/8.25/8.375/8.5 frequency divider circuit, where the programmable parameters are selected as A=2, B=4, M=4, and P=8. In this exemplary 4-bit phase rotator embodiment, the resolution is 0.125, while the range is once again 60.0 to 68.0.

FIG. 14 is an exemplary table diagram that shows the possible division ratios possible division ratio values for the exemplary embodiment of FIG. 13, based on Equations 6 and 10, for example. It is to be noted that in shifting from a 2-bit phase rotator to a 4-bit phase rotator, the overall range of division ratios does not change (compare FIGS. 12 and 14), although the resolution is decreased by a factor of four.

Although exemplary embodiments of the invention have been described herein with reference to the accompanying drawings, it is to be understood that the invention is not limited to those embodiments, and that various other changes and modifications may be effected therein by one skilled in the art without departing from the scope or spirit of the invention. All such changes and modifications are intended to be included within the scope of the invention as defined by the claims.

We claim:

1. A fractional frequency divider circuit, comprising:
 a prescaler circuit that divides a frequency of an input signal by a factor of A and outputs a plurality of phase-shifted signals each having a frequency of 1/A, the phase-shifted signals comprising differential I (in-phase) and Q (quadrature-phase) phase signals;
 a phase rotator circuit that can phase interpolate between the plurality of phase-shifted signals output from the prescaler circuit to generate a plurality of phase-shift states having a minimum phase-shift resolution of $\Delta\phi$;
 a phase rotator controller that generates control signals to control the operation of the phase rotator circuit, wherein the phase rotator circuit rotatably outputs one or more of the plurality of phase-shift states in accordance with an angular direction of rotation and a phase-shift output resolution, $\pm k\,\Delta\phi$, as specified by the control signals;
 a postscaler circuit that divides a frequency of an output signal of the phase rotator circuit by a factor of B, and which outputs a clock signal which controls the phase rotator controller and which defines a control cycle for the phase rotator circuit;
 wherein the fractional frequency divider circuit generates an arbitrary sub-integer-N divisor $N(k)=(AB+Ak\,\Delta\phi/2\pi)$, wherein at least k is a programmable parameter, wherein AB denotes an integer portion of the divisor, wherein where $A\Delta\phi/2\pi$ denotes a minimum fractional portion of the divisor, and wherein A and B can be integer values $\geq 1$.

2. The fractional frequency divider circuit of claim 1, wherein the phase rotator circuit is an M-bit phase rotator circuit that can generate a plurality of phase-shift states having a minimum phase-shift resolution $$\Delta\phi = \frac{2\pi}{2^M}.$$

3. The fractional frequency divider circuit of claim 2, wherein k is programmable to be any integer value, including 0, where $|\pm k|\leq 2^{M-2}$.

4. The fractional frequency divider circuit of claim 3, wherein M=2 and k is −1, 0, or +1 to provide a programmable tri-modulus frequency divider circuit.

5. The fractional frequency divider of claim 4, wherein A=2 and B=4 providing a programmable tri-modulus divide-by-7.5/8/8.5 frequency divider circuit.

6. The fractional frequency divider circuit of claim 3, wherein M=4 and k is −4, −3, −2, −1, 0, +1, +2, +3 or +4 to provide a programmable nine-modulus frequency divider circuit.

7. The fractional frequency divider circuit of claim 6, wherein A=2 and B=4 providing a programmable nine-modulus divide-by-7.5/7.625/7.75/7.875/8/8.125/8.25/8.375/8.5 frequency divider circuit.

8. The fractional frequency divider of claim 1, wherein the phase rotator circuit generates a plurality of phase-shift states including I+Q, I−Q, −I+Q, and −I−Q phase-shift states by phase interpolation between the differential I and Q phase signals.

9. The fractional frequency divider of claim 1, further comprising:
 a slewing buffer operatively connected between an output of the phase rotator control circuit and control signal input ports of the phase rotator, wherein the slewing buffer delays or otherwise increases a slew rate of control signals output from the phase rotator controller to smoothly interpolate from one phase-shift state to a next-phase shift state, to thereby reduce or eliminate glitches in the output signal of the phase rotator circuit; and
 a limiter amplifier coupled to the output of the phase rotator to maintain a constant amplitude of the output signal of the phase rotator circuit by compensating for decreases in the amplitude of the output signal of the phase rotator which may occur by virtue of using slewed control signals.

10. A PLL (phase-locked loop) frequency synthesizer, comprising:
 a phase detector;
 a low pass filter coupled to the output of the phase detector;
 a VCO (voltage controlled oscillator) coupled to the output of the low-pass filter;

a fractional frequency divider circuit connected in a feedback loop between an output of the VCO and an input to the phase detector, wherein the fractional frequency divider circuit comprises:

a prescaler circuit that divides a frequency of an input signal by a factor of A and outputs a plurality of phase-shifted signals each having a frequency of 1/A, the phase-shifted signals comprising differential I (in-phase) and Q (quadrature-phase) phase signals;

a phase rotator circuit that can phase interpolate between the plurality of phase-shifted signals output from the prescaler circuit to generate a plurality of phase-shift states having a minimum phase-shift resolution of $\Delta\phi$;

a phase rotator controller that generates control signals to control the operation of the phase rotator circuit, wherein the phase rotator circuit, rotatably outputs one or more of the plurality of phase-shift states in accordance with an angular direction of rotation and a phase-shift output resolution, $\pm k\,\Delta\phi$, as specified by the control signals;

a postscaler circuit that divides a frequency of an output signal of the phase rotator circuit by a factor of B, and which outputs a clock signal which controls the phase rotator controller and which defines a control cycle for the phase rotator circuit;

wherein the fractional frequency divider circuit generates an arbitrary sub-integer-N divisor $N(k)=(AB+Ak\,\Delta\phi/2\pi)$, wherein at least k is a programmable parameter, wherein AB denotes an integer portion of the divisor, wherein $$A\frac{\Delta\phi}{2\pi}$$

denotes a minimum fractional portion of the divisor, and wherein A and B can be integer values $\geq 1$.

11. The PLL frequency synthesizer of claim 10, wherein the phase rotator circuit is an M-bit phase rotator circuit that can generate a plurality of phase-shift states having a minimum phase-shift resolution $$\Delta\phi = \frac{2\pi}{2^M}.$$

12. The PLL frequency synthesizer of claim 11, wherein k is programmable to be any integer value, including 0, where $|\pm k|\leq 2^{M-2}$.

13. The PLL frequency synthesizer of claim 12, wherein M=2 and k is −1, 0, or +1 to provide a programmable tri-modulus frequency divider circuit.

14. The PLL frequency synthesizer of claim 13, wherein A=2 and B=4 providing a programmable tri-modulus divide-by-7.5/8/8.5 frequency divider circuit.

15. The PLL frequency synthesizer of claim 12, wherein M=4 and k is −4, −3, −2, −1, 0, +1, +2, +3 or +4 to provide a programmable nine-modulus frequency divider circuit.

16. The PLL frequency synthesizer of claim 15, wherein A=2 and B=4 providing a programmable nine-modulus divide-by-7.5/7.625/7.75/7.875/8/8.125/8.25/8.375/8.5 frequency divider circuit.

17. The PLL frequency synthesizer of claim 10, wherein the phase rotator circuit generates a plurality of phase-shift states including I+Q, I−Q, −I+Q, and −I−Q phase-shift states by phase interpolation between the differential I and Q phase signals.

18. The PLL frequency synthesizer of claim 10, further comprising:

a slewing buffer operatively connected between an output of the phase rotator control circuit and control signal input ports of the phase rotator, wherein the slewing buffer delays or otherwise increases a slew rate of control signals output from the phase rotator controller to smoothly interpolate from one phase-shift state to a next-phase shift state, to thereby reduce or eliminate glitches in the output signal of the phase rotator circuit; and a limiter amplifier coupled to the output of the phase rotator to maintain a constant amplitude of the output signal of the phase rotator circuit by compensating for decreases in the amplitude of the output signal of the phase rotator which may occur by virtue of using slewed control signals.

19. A fractional frequency divider circuit, comprising:

a prescaler circuit that divides a frequency of an input signal by a factor of A and outputs a plurality of phase-shifted signals each having a frequency of 1/A, the phase-shifted signals comprising differential I (in-phase) and Q (quadrature-phase) phase signals;

a phase rotator circuit that can phase interpolate between the plurality of phase-shifted signals output from the prescaler circuit to generate a plurality of phase-shift states having a minimum phase-shift resolution of $\Delta\phi$;

a modulus controller that generates control signals to control the operation of the phase rotator circuit, wherein the phase rotator circuit rotatably outputs one or more of the plurality of phase-shift states in accordance with an angular direction of rotation and a phase-shift output resolution as specified by the control signals, wherein the modulus controller comprises a phase rotator control circuit and a program-swallowed framework comprising a P counter and an S counter;

a postscaler circuit that divides a frequency of an output signal of the phase rotator by a factor of B, and which outputs a clock signal which controls the modulus controller and defines a control cycle for the phase rotator circuit;

wherein the fractional frequency divider circuit generates an arbitrary sub-integer-N divisor, $$N_{TOT}(k_1, k_2) = ABP + A\frac{\Delta\phi}{2\pi}[Pk_2 + S(k_1 - k_2)],$$

wherein at least $k_2$ and $k_1$ and S are programmable parameters, wherein ABP denotes an integer portion of the divisor and where $$A\frac{\Delta\phi}{2\pi}$$

denotes a minimum fractional portion of the divisor, and wherein A, B and P can be integer values $\geq 1$, and wherein S can be an integer value $\geq 0$ and $\leq P$.

20. The fractional frequency divider circuit of claim 19, wherein the phase rotator circuit is an M-bit phase rotator, providing a minimum phase shift resolution $$\Delta\phi = \frac{2\pi}{2^M}.$$

21. The fractional frequency divider circuit of claim 20, wherein the values of $k_1$ and $k_2$ are programmable to be any integer value, including 0, wherein $|\pm k_1| \leq 2^{M-2}$, $|\pm k_2| \leq 2^{M-2}$ and $k_1 - k_2 = 1$.

22. The fractional frequency divider circuit of claim 21, wherein A=2, B=4, M=2, P=7, S is programmable from 0 to P, $k_1$=0, or +1 and $k_2$=−1, or 0, to provide a programmable divide-by-7.5/8/8.5 tri-modulus divider with divider values from 52.5 to 59.5 in sub-integer steps of 0.5.

23. The fractional frequency divider circuit of claim 21, wherein A=2, B=4, M=2, P=8, S is programmable from 0 to P, $k_1$=0 or +1 and $k_2$=−1 or 0, to provide a programmable divide-by-7.5/8/8.5 tri-modulus frequency divider circuit with divider values from 60.0 to 68.0 in sub-integer steps of 0.5.

24. The fractional frequency divider circuit of claim 21, wherein A=2, B=4, M=4, P=8, S is programmable from 0 to P, $k_1$=−3, −2, −1, 0, +1, +2, +3 or +4, and $k_2$=−4, −3, −2, −1, 0, +1, +2, or +3, to provide a programmable divide-by-7.5/7.625/7.75/7.875/8/8.125/8.25/8.375/8.5 nine-modulus frequency divider circuit with divider values from 60.0 to 68.0 in sub-integer steps of 0.125.

25. The fractional frequency divider of claim 19, further comprising:
a slewing buffer operatively connected between an output of the phase rotator control circuit and control signal input ports of the phase rotator, wherein the slewing buffer delays or otherwise increases a slew rate of control signals output from the phase rotator controller to smoothly interpolate from one phase-shift state to a next-phase shift state, to thereby reduce or eliminate glitches in the output signal of the phase rotator circuit; and
a limiter amplifier coupled to the output of the phase rotator to maintain a constant amplitude of the output signal of the phase rotator circuit by compensating for decreases in the amplitude of the output signal of the phase rotator which may occur by virtue of using slewed control signals.

26. A PLL (phase-locked loop) frequency synthesizer, comprising:
a phase detector;
a low pass filter coupled to the output of the phase detector;
a VCO (voltage controlled oscillator) coupled to the output of the low pass filter;
a fractional frequency divider circuit connected in a feedback loop between an output of the VCO and an input to the phase-frequency detector, wherein the fractional frequency divider circuit comprises:
a prescaler circuit that divides a frequency of an input signal by a factor of A and outputs a plurality of phase-shifted signals each having a frequency 1/A, the phase-shifted signals comprising differential I (in-phase) and Q (quadrature-phase) phase signals;
a phase rotator circuit that can phase interpolate between the plurality of phase-shifted signals output from the prescaler circuit to generate a plurality of phase-shift states having a minimum phase-shift resolution of Δφ;
a modulus controller that generates control signals to control the operation of the phase rotator circuit, wherein the phase rotator circuit rotatably outputs one or more of the plurality of phase-shift states in accordance with an angular direction of rotation and a phase-shift output resolution as specified by the control signals, wherein the modulus controller comprises a phase rotator control circuit and a program-swallowed framework comprising a P counter and an S counter;
a postscaler circuit that divides a frequency of an output signal of the phase rotator by a factor of B, and which outputs a clock signal which controls the modulus controller and defines a control cycle for the phase rotator circuit;
wherein the fractional frequency divider circuit generates an arbitrary sub-integer-N divisor, $$N_{TOT}(k_1, k_2) = ABP + A\frac{\Delta\phi}{2\pi}[Pk_2 + S(k_1 - k_2)],$$

wherein at least $k_2$ and $k_1$ and S are programmable parameters, wherein ABP denotes an integer portion of the divisor and where $$A\frac{\Delta\phi}{2\pi}$$

denotes a minimum fractional portion of the divisor, and wherein A, B and P can be integer values $\geq 1$, and wherein S can be an integer value $\geq 0$ and $\leq P$.

27. The PLL frequency synthesizer circuit of claim 26, wherein the phase rotator circuit is an M-bit phase rotator, providing a minimum phase shift resolution $$\Delta\phi = \frac{2\pi}{2^M}.$$

28. The PLL frequency synthesizer circuit of claim 27, wherein the values of $k_1$ and $k_2$ are programmable to be any integer value, including 0, wherein $|\pm k_1| \leq 2^{M-2}$, $|\pm k_2| \leq 2^{M-2}$ and $k_1 - k_2 = 1$.

29. The PLL frequency synthesizer circuit of claim 28, wherein A=2, B=4, M=2, P=7, S is programmable from 0 to P, $k_1$=0, or +1 and $k_2$=−1, or 0, to provide a programmable divide-by-7.5/8/8.5 tri-modulus divider with divider values from 52.5 to 59.5 in sub-integer steps of 0.5.

30. The PLL frequency synthesizer circuit of claim 28, wherein A=2, B=4, M=2, P=8, S is programmable from 0 to P, $k_1$=0 or +1 and $k_2$=−1 or 0, to provide a programmable divide-by-7.5/8/8.5 tri-modulus frequency divider circuit with divider values from 60.0 to 68.0 in sub-integer steps of 0.5.

31. The PLL frequency synthesizer circuit of claim 28, wherein A=2, B=4, M=4, P=8, S is programmable from 0 to P, $k_1$=−3, −2, −1, 0, +1, +2, +3 or +4 and $k_2$=−4, −3, −2, −1, 0, +1, +2, or +3, to provide a programmable divide-by-7.5/7.625/7.75/7.875/8/8.125/8.25/8.375/8.5 nine-modulus frequency divider circuit with divider values from 60.0 to 68.0 in sub-integer steps of 0.125.

32. The PLL frequency synthesizer of claim 26, further comprising:

a slewing buffer operatively connected between an output of the phase rotator control circuit and control signal input ports of the phase rotator, wherein the slewing buffer delays or otherwise increases a slew rate of control signals output from the phase rotator controller to smoothly interpolate from one phase-shift state to a next-phase shift state, to thereby reduce or eliminate glitches in the output signal of the phase rotator circuit; and a limiter amplifier coupled to the output of the phase rotator to maintain a constant amplitude of the output signal of the phase rotator circuit by compensating for decreases in the amplitude of the output signal of the phase rotator which may occur by virtue of using slewed control signals.

33. A method for performing sub-integer frequency division of a frequency signal, comprising:

dividing a frequency of an input signal by a factor of A phase interpolating between a plurality of phase-shifted signals each having, a frequency of 1/A of the input signal to generate a plurality of phase-shift states having a minimum phase-shift resolution of $\Delta\phi$;

rotatably outputting a phase state signal corresponding to one or more of the plurality of phase-shift states, based on control signals that specify an angular direction of rotation and a phase-shift output resolution;

dividing a frequency of an output phase state signal by a factor of B so as to achieve a sub-integer-N divisor $N(k)=(AB+Ak\,\Delta\phi/2\pi)$, wherein at least k is a programmable parameter, wherein AB denotes an integer portion of the divisor and where $$A\frac{\Delta\phi}{2\pi}$$

denotes a minimum fractional portion of the divisor, and wherein A and B can be integer values $\geq 1$.

* * * * *